(12) United States Patent
Heyd et al.

(10) Patent No.: US 11,687,480 B2
(45) Date of Patent: Jun. 27, 2023

(54) MODULAR UNIT NETWORK INTERFACE CARD

(71) Applicant: Liqid Inc., Broomfield, CO (US)

(72) Inventors: Andrew Rudolph Heyd, Longmont, CO (US); Brenden Michael Rust, Loveland, CO (US); Jason Breakstone, Broomfield, CO (US); Sumit Puri, Calabasas, CA (US); Bryan Schramm, Broomfield, CO (US)

(73) Assignee: Liqid Inc., Broomfield, CO (US)

( * ) Notice: Subject to any disclaimer, the term of this patent is extended or adjusted under 35 U.S.C. 154(b) by 97 days.

(21) Appl. No.: 17/151,800

(22) Filed: Jan. 19, 2021

(65) Prior Publication Data

US 2021/0141756 A1 May 13, 2021

Related U.S. Application Data

(63) Continuation of application No. 15/727,228, filed on Oct. 6, 2017, now Pat. No. 10,922,260.

(Continued)

(51) Int. Cl.
| | |
|---|---|
| H05K 7/00 | (2006.01) |
| G06F 13/40 | (2006.01) |
| H05K 7/14 | (2006.01) |
| H04L 12/40 | (2006.01) |
| H04L 12/00 | (2006.01) |

(Continued)

(52) U.S. Cl.
CPC .......... *G06F 13/4081* (2013.01); *G06F 13/00* (2013.01); *G06F 13/4022* (2013.01); *G06F 13/4282* (2013.01); *H04L 12/00* (2013.01); *H04L 12/40013* (2013.01);

(Continued)

(58) Field of Classification Search
None
See application file for complete search history.

(56) References Cited

U.S. PATENT DOCUMENTS

| | | | |
|---|---|---|---|
| 5,602,717 A | 2/1997 | Leshem et al. | |
| 6,043,984 A * | 3/2000 | Tseng | H05K 7/1431 174/16.3 |

(Continued)

FOREIGN PATENT DOCUMENTS

| | | |
|---|---|---|
| CN | 202145312 U | 2/2012 |
| CN | 202995541 U | 6/2013 |

(Continued)

OTHER PUBLICATIONS

Addonics Technologies, Inc., Datasheet for "2.5" U.2 M2 PCle/NVMe SSD Drive, 2 pages, May 31, 2016.

(Continued)

*Primary Examiner* — Anthony Q Edwards
*Assistant Examiner* — Rashen E Morrison

(57) ABSTRACT

Systems, methods, and software are disclosed herein having enhanced modular carrier form factors. In an implementation, an apparatus includes a carrier insertable into a modular bay of a chassis assembly, and a network interface card (NIC). The apparatus includes an Ethernet network cable connector configured to carry Ethernet signaling of the NIC, and a device U.2 connector configured to carry host communications of the NIC and mate with a mating U.2 connector of the modular bay when the carrier is inserted into the chassis assembly.

8 Claims, 11 Drawing Sheets

Related U.S. Application Data

(60) Provisional application No. 62/405,536, filed on Oct. 7, 2016.

(51) Int. Cl.
    *G06F 13/00*     (2006.01)
    *G06F 13/42*     (2006.01)
    *H05K 1/02*     (2006.01)
    *H05K 1/11*     (2006.01)

(52) U.S. Cl.
    CPC .............. *H05K 1/028* (2013.01); *H05K 1/11* (2013.01); *H05K 7/14* (2013.01); *G06F 2213/0026* (2013.01)

(56) References Cited

U.S. PATENT DOCUMENTS

| | | | |
|---|---|---|---|
| 7,051,215 | B2 | 5/2006 | Zimmer et al. |
| 8,799,702 | B2 * | 8/2014 | Buckland ............ G06F 13/4022 |
| | | | 714/6.13 |
| 9,429,724 | B2 | 8/2016 | Julien et al. |
| 9,439,724 | B2 | 9/2016 | Gross |
| 10,588,237 | B2 | 3/2020 | Zhai et al. |
| 2004/0255171 | A1 * | 12/2004 | Zimmer ................ G06F 1/3203 |
| | | | 713/300 |
| 2009/0063895 | A1 | 3/2009 | Smith |
| 2013/0024595 | A1 | 1/2013 | Subramaniyan et al. |
| 2014/0365714 | A1 | 12/2014 | Sweere et al. |
| 2015/0257302 | A1 | 9/2015 | Masuyama et al. |
| 2015/0277512 | A1 | 10/2015 | Davis et al. |
| 2015/0278139 | A1 | 10/2015 | Pamley et al. |
| 2015/0309951 | A1 | 10/2015 | Breakstone et al. |
| 2015/0355686 | A1 * | 12/2015 | Heyd .................. G11B 33/128 |
| | | | 361/679.31 |
| 2015/0370665 | A1 * | 12/2015 | Cannata ................ G06F 3/0685 |
| | | | 714/4.11 |
| 2016/0073544 | A1 * | 3/2016 | Heyd ...................... G06F 1/185 |
| | | | 361/679.31 |
| 2016/0154765 | A1 | 6/2016 | Shin |
| 2016/0259754 | A1 * | 9/2016 | Ping .................... G06F 13/4081 |
| 2017/0164501 | A1 * | 6/2017 | Killen .................. H05K 7/1492 |
| 2017/0168943 | A1 * | 6/2017 | Chou .................... G06F 13/1673 |
| 2017/0220505 | A1 * | 8/2017 | Breakstone ......... G06F 13/4282 |
| 2017/0262029 | A1 * | 9/2017 | Nelson ................. H05K 7/1487 |
| 2017/0269871 | A1 * | 9/2017 | Khan .................. G06F 11/0769 |
| 2017/0308325 | A1 * | 10/2017 | Pearson ................. G06F 3/0604 |
| 2018/0032462 | A1 | 2/2018 | Olarig et al. |

FOREIGN PATENT DOCUMENTS

| | | |
|---|---|---|
| CN | 204130738 U | 1/2015 |
| CN | 102541790 B | 4/2015 |
| TW | 287751 B | 10/2007 |
| WO | 2014149039 A1 | 9/2014 |
| WO | 2015126383 A1 | 8/2015 |
| WO | 2016122555 A1 | 8/2016 |

OTHER PUBLICATIONS

International Application No. PCT/US2017/055490, International Search Report & Written Opinion, 11 pages, dated Feb. 7, 2018.

Office Action, Taiwan Patent Application No. 106134324, 11 pages, dated May 1, 2019.

Extended European Search Report, European Application No. 17859246.5, 6 pages, dated Apr. 17, 2020.

Office Action, Chinese Patent Application No. 201780076020.9, 13 pages, dated Apr. 30, 2020.

* cited by examiner

MODULAR UNIT NETWORK INTERFACE CARD

RELATED APPLICATIONS

This application is a continuation of U.S. patent application Ser. No. 15/727,228, titled "MODULAR CARRIER FORM FACTORS FOR COMPUTING PLATFORMS," filed on Oct. 6, 2017; which claims the benefit of and priority to U.S. Provisional Patent Application 62/405,536, titled "ENHANCED PCIe MODULAR CARRIER FORM FACTORS," filed Oct. 7, 2016, which is hereby incorporated by reference in its entirety.

FIELD OF THE INVENTION

Aspects of the disclosure are related to the field of data storage systems and data communication, and in particular, to solid-state storage systems and network communications.

BACKGROUND

Computer systems typically include bulk storage systems, such as magnetic disk drives, optical storage devices, tape drives, or solid-state storage drives, among other storage systems. As storage needs have increased in these computer systems, networked storage systems have been introduced which store large amounts of data in a storage environment physically separate from end user computer devices. These networked storage systems typically provide access to bulk data storage over one or more network interfaces to end users or other external systems. In addition to storage of data, remote computing systems include various processing systems that can provide remote computing resources to end users. These networked storage systems and remote computing systems can be included in high-density installations, such as rack-mounted environments.

However, as the densities of networked storage systems and remote computing systems increase, various physical limitations can be reached. These limitations include density limitations based on the underlying storage technology, such as in the example of large arrays of rotating magnetic media storage systems. These limitations can also include computing density limitations based on the various physical space requirements for network interconnect as well as the large space requirements for environmental climate control systems.

In addition to physical space limitations, these bulk storage systems have been traditionally limited in the number of devices that can be included per host, which can be problematic in storage environments where higher capacity, redundancy, and reliability is desired. These shortcomings can be especially pronounced with the increasing data storage and retrieval needs in networked, cloud, and enterprise environments.

OVERVIEW

Systems, methods, and software are disclosed herein having enhanced modular carrier form factors. In an implementation, an apparatus includes a carrier insertable into a modular bay of a chassis assembly, and a network interface card (NIC). The apparatus includes an Ethernet network cable connector configured to carry Ethernet signaling of the NIC, and a device U.2 connector configured to carry host communications of the NIC and mate with a mating U.2 connector of the modular bay when the carrier is inserted into the chassis assembly.

This Overview is provided to introduce a selection of concepts in a simplified form that are further described below in the Detailed Description. It may be understood that this Overview is not intended to identify key features or essential features of the claimed subject matter, nor is it intended to be used to limit the scope of the claimed subject matter.

BRIEF DESCRIPTION OF THE DRAWINGS

Many aspects of the disclosure can be better understood with reference to the following drawings. The components in the drawings are not necessarily to scale, emphasis instead being placed upon clearly illustrating the principles of the present disclosure. Moreover, in the drawings, like reference numerals designate corresponding parts throughout the several views. While several embodiments are described in connection with these drawings, the disclosure is not limited to the embodiments disclosed herein. On the contrary, the intent is to cover all alternatives, modifications, and equivalents.

DETAILED DESCRIPTION

Before any embodiments are explained in detail, it is to be understood that the embodiments described herein are not limited in their application to the details of construction and the arrangement of components set forth in the following description or illustrated in the following drawings. Embodiments may be practiced or carried out in various ways.

Also, it is to be understood that the phraseology and terminology used herein is for the purpose of description and should not be regarded as limiting. The use of "including," "comprising" or "having" and variations thereof herein is meant to encompass the items listed thereafter and equivalents thereof as well as additional items. The terms "connected" and "coupled" are used broadly and encompass both direct and indirect mounting, connecting, and coupling. Further, "connected" and "coupled" are not restricted to physical or mechanical connections or couplings, and may include electrical connections or couplings, whether direct or indirect. Also, electronic communications and notifications may be performed using any known means including direct or indirect wired connections, wireless connections, and combinations thereof. Also, functionality described as being performed by one device may be distributed among a plurality of devices.

It should also be noted that a plurality of hardware and software based devices, as well as a plurality of different structural components may be used to implement the embodiments set forth herein. In addition, it should be understood that embodiments may include hardware, software, and electronic components that, for purposes of discussion, may be illustrated and described as if the majority of the components were implemented solely in hardware. However, one of ordinary skill in the art, and based on a reading of this detailed description, would recognize that, in at least one embodiment, the electronic-based aspects of the embodiments may be implemented in software (e.g., stored on non-transitory computer-readable medium) executable by one or more electronic processors.

Figure 1:
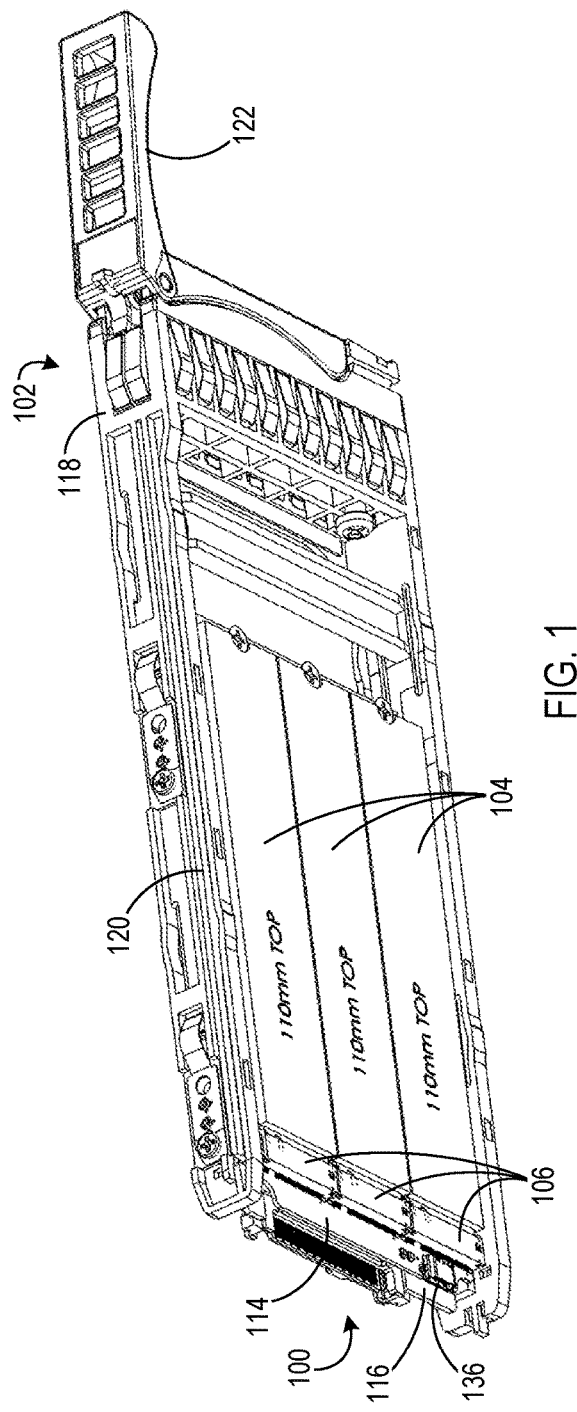
FIG. 1 illustrates an example storage device implementation according to some embodiments.
Figure 2:
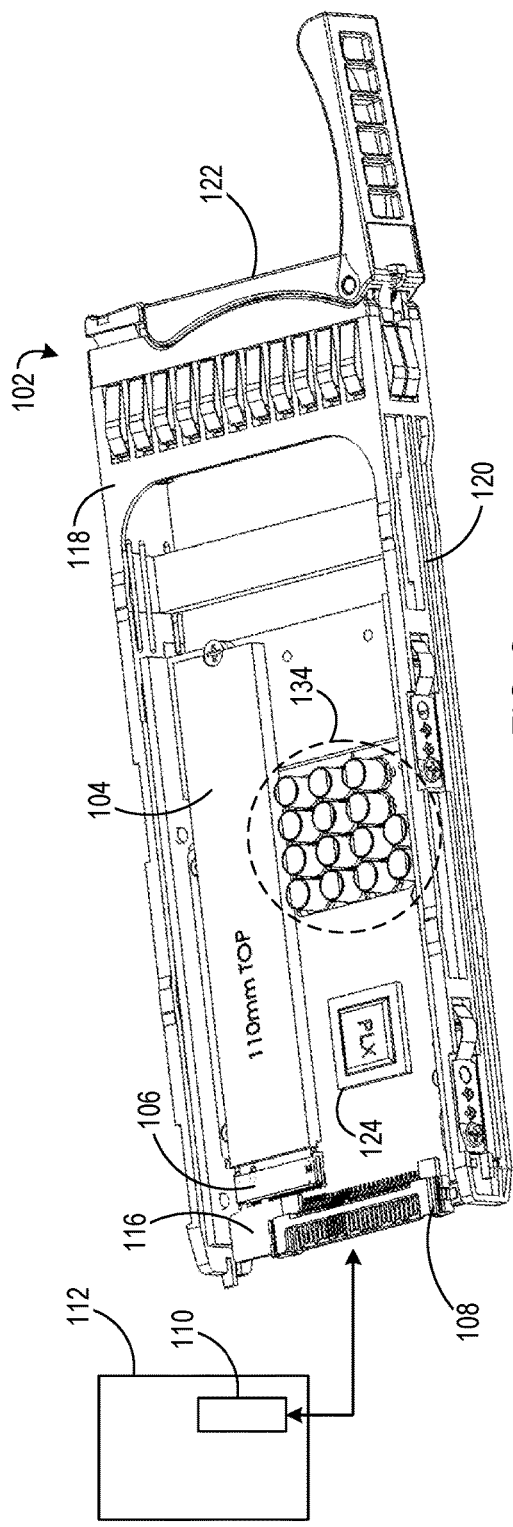
FIG. 2 illustrates an example storage device implementation according to some embodiments.
Figure 3:
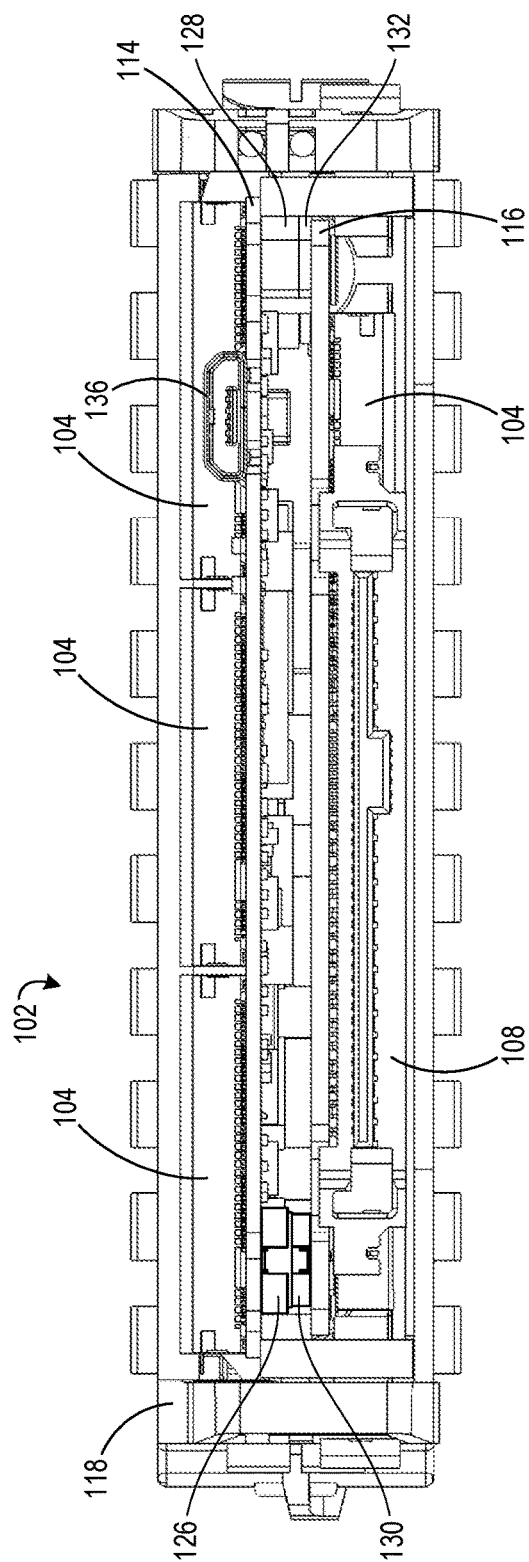
FIG. 3 illustrates an example storage device implementation according to some embodiments.

FIGS. 1-3 illustrate an exemplary storage card assembly 100 mounted to in an M.2 chassis sled or M.2 carrier 102, which is insertable into a two-unit (2 U) chassis. Storage card assembly 100 includes four M.2 solid-state drives (SSDs) 104, although other embodiments may include more or less M.2 SSDs. Elements of FIGS. 1-3 can correspond to similar elements of FIGS. 14-16, although variations are possible. A connector 106 for each SSD 104 is shown connected to storage card assembly 100. Connectors 106 couple with a Peripheral Component Interconnect Express (PCIe) interface of each respective SSD 104.

Figure 14:
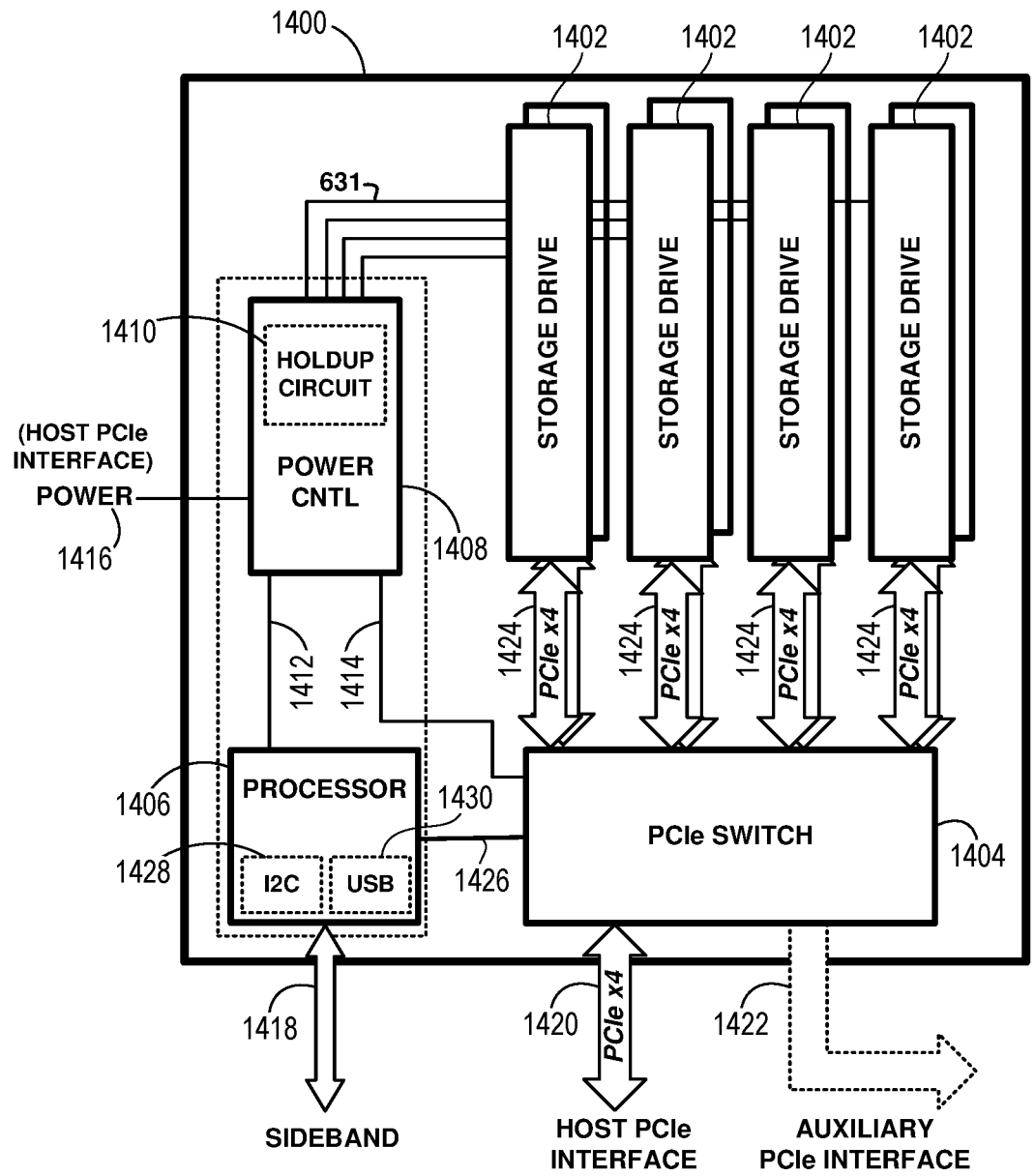
FIG. 14 illustrates an example storage system in an implementation.

A U.2 connector 108 is employed and insertable into a mating U.2 socket connector 110 of a 2 U host system 112, such as a motherboard or daughterboard of a computer or server system. Communications between host system 112 and mating U.2 socket connector 110 carry PCIe signaling, and can be referred to as SFF-8639 interfaces in some examples. Each PCIe link associated with connectors 106 and U.2 connector 108 are provided by PCIe switch circuit 1632. In some examples, a main PCIe interface is provided over U.2 connector 108 to an associated host, along with power and sideband signaling, such as seen in FIG. 14 for links 1416, 1420, and portions of link 1418. Auxiliary PCIe interfaces, such as link 1422 in FIG. 14, can be provided over an external connector in some examples.

As illustrated in FIGS. 1-3, storage card assembly 100 can include cards 114, 116 having one or more M.2 SSDs 104 and corresponding connectors 106. In these examples, the M.2 SSDs 104 comprise four 110 millimeter (mm) sized M.2 SSDs; however, other sizes such as 80 mm M.2 SSDs may also be used. Other sizes of M.2 SSDs can be included, such as lengths of 16, 26, 30, 38, 42, 60, 80 and 110 mm and widths of 12, 16, 22 and 30 mm.

M.2 carrier 102 includes side walls 118 configured to support the arrangement of storage card assembly 100 within a 2 U chassis. Walls 118 include rails 120 configured to slide into mating rails of a chassis (400 of FIG. 4) to facilitate installation and removal of storage card assembly 100 with respect to mating PCIe socket 110 of 2 U host system 112. A pivotable locking lever 122 allows the M.2 carrier 102 to be secured to the 2 U host system chassis when installed. FIGS. 1 and 2 illustrate the locking lever 122 in a locked position superimposed with an unlocked position.

When connected to a cable or host system via U.2 connector 108, such as a motherboard or daughterboard of a computer or server system, drive 100 can provide data storage capacity to the host system. Data can be stored and retrieved from storage media associated with SSDs 104. A PCIe switch circuit 124 is included on circuit board 114 and provides PCIe interfacing to the host system as well as PCIe fan-out to each individual M.2 SSD and auxiliary PCIe interface. PCIe switch 124, which may comprise a PLX Technology PEX8725 10-port, 24 lane PCIe switch chip, may be configured to handle the communications. Power control circuitry is also included with one or more energy storage arrays to provide holdup power upon loss of power to drive 100 or removal of drive 100 from a host. In-flight data or unwritten data can be committed to non-volatile storage media, such as M.2 SSDs 104, upon loss of input power via the holdup power.

Circuit boards 114 and 116 each comprise assemblies of various circuitry, connectors, materials, interconnect, coatings, markings, fastener features, and other elements. Typically, circuit boards 114 and 116 each comprise an individual printed circuit board as a base onto which various components are mounted and into which electrical or optical interconnect is formed. Circuit boards 114 and 116 each can be fastened to carrier 102 for structural support and vibration resiliency. Circuit board 114 includes two connectors 126, 128 in this example to mate with circuit board 116. One or more connectors can be employed in further examples. Circuit board connector 126 of circuit board 114 couples to circuit board connector 130 of circuit board 116. Circuit board connector 128 of circuit board 114 couples to circuit board connector 132 of circuit board 116. In one example, a first connector pair (126, 130) carries supply power from board 116 to board 114, while the other connector pair (128, 132) carries the PCIe signaling between boards 114-116, or vice-versa, along with other signaling and combinations thereof.

The circuit board connectors are configured to carry power and signals between the boards. The signaling comprises PCIe signaling, sideband signaling, control signaling, discrete signaling, digital signaling, or analog signaling, among other signaling. The power includes device power for powering storage devices 104 as well as for other circuit components on each board. Typically, input power is provided from a host system or other power source via main connector 108 to bottom circuit board 116. A power control circuitry is employed on bottom circuit board 116 that distributes the input power to the various components of circuit board 116 via signaling associated with circuit board 116. Additionally, the power control circuitry of circuit board 116 distributes this input power over one or more of the internal connectors (circuit board connector 130 or circuit board connector 132) to circuit board 114 over an associated connector on circuit board 114 (circuit board connector 130 or circuit board connector 132). The power control circuitry can include power conditioning, filtering, conversion, and handling circuitry. Various voltages can be employed and converted among. Circuit board 114 can include further power control circuitry.

In some examples, holdup power is stored within capacitor array 134 on circuit board 116. This holdup power might be stored at a predetermined voltage level, which might be a higher voltage level than the input power, such as 30 VDC or higher (see FIG. 15). This holdup power at the high voltage might be supplied to voltage step-down circuitry on circuit board 116 for conversion to a working voltage similar to the input voltage (such as a supply voltage for memory devices 104 plugged into connectors 106 on circuit board 116). In further examples, this holdup power at the high voltage might also be supplied via one of the internal connectors to circuit board 114. Further voltage conversion circuitry can be included on circuit board 114 to convert the high voltage to a working voltage similar to the input voltage or a suitable voltage for circuit components on circuit board 114 (such as a supply voltage for memory card 104 plugged into connector 106 on circuit board 114).

FIGS. 1 and 3 also illustrate an auxiliary connector 136 for connecting M.2 SSDs 104 to a system with an auxiliary interface. Auxiliary connector 136 can comprise sideband interfaces, such as Universal Serial Bus (USB) interfaces, Serial Advanced Technology Attachment (SATA) interfaces, auxiliary power interfaces, or other interfaces that are auxiliary to main connector 108. Auxiliary connector 116 might be employed to carry management signals, monitoring or control signals, initialization signals, debug or troubleshooting signals, among others, including combinations thereof. In some examples, auxiliary connector 116 can be omitted.

Figure 4:
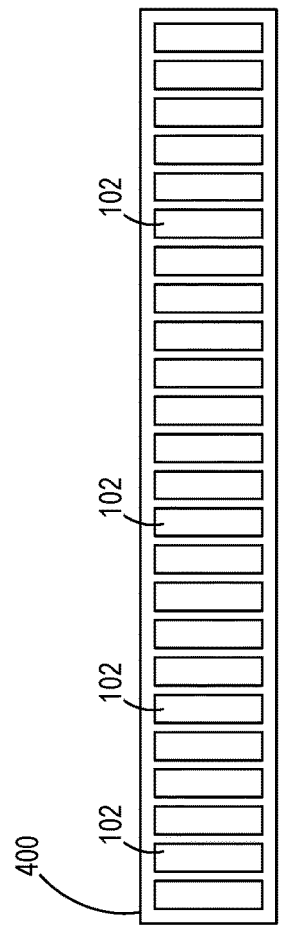
FIG. 4 illustrates an example chassis implementation according to some embodiments.

FIG. 4 illustrates a block diagram of a chassis 400 according to an embodiment. Chassis 400 may be a 2-U chassis capable of being positioned within a rack unit known in the art. Chassis 400 includes twenty-four carriers 102, in one example, each M.2 carrier 102 housing a storage card 100 or other embodiment described herein. However, more or less than twenty-four carriers may be positioned within chassis 400 according to some embodiments.

Figure 5:
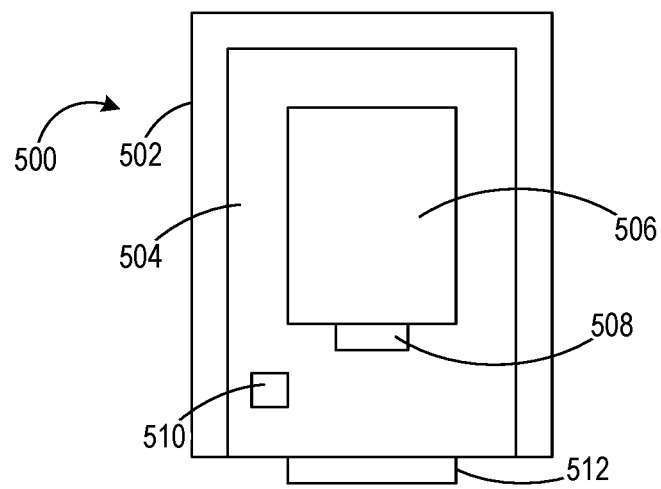
FIG. 5 illustrates an example carrier assembly implementation according to some embodiments.

FIG. 5 illustrates a block diagram of a carrier assembly 500 according to an embodiment. Carrier assembly 500 includes a carrier 502 housing a card assembly 504. Carrier 504 may be similar to M.2 carrier 102 described above. Card assembly 504 includes a HDD 506 having a SATA interface 508. A PCIe switch 510, which may comprise a PLX Technology PEX8725 10-port, 24 lane PCIe switch chip, may be configured to convert communications between a SATA protocol via the SATA interface 508 and a PCIe protocol via a PCIe edge connector 512.

Figure 6:
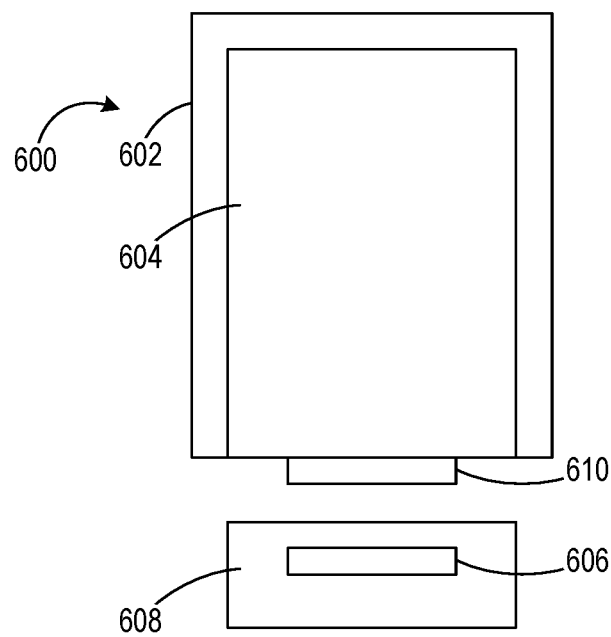
FIG. 6 illustrates an example carrier assembly implementation according to some embodiments.

FIG. 6 illustrates a block diagram of a carrier assembly 600 according to an embodiment. Carrier assembly 600 includes a carrier 602 housing a card assembly 604. Carrier 602 may be similar to M.2 carrier 102 described above. Card assembly 604 comprises a network interface card (NIC) coupleable to a U.2 connector 606 of a host system 608 via a U.2 edge connector 610.

Figure 7:
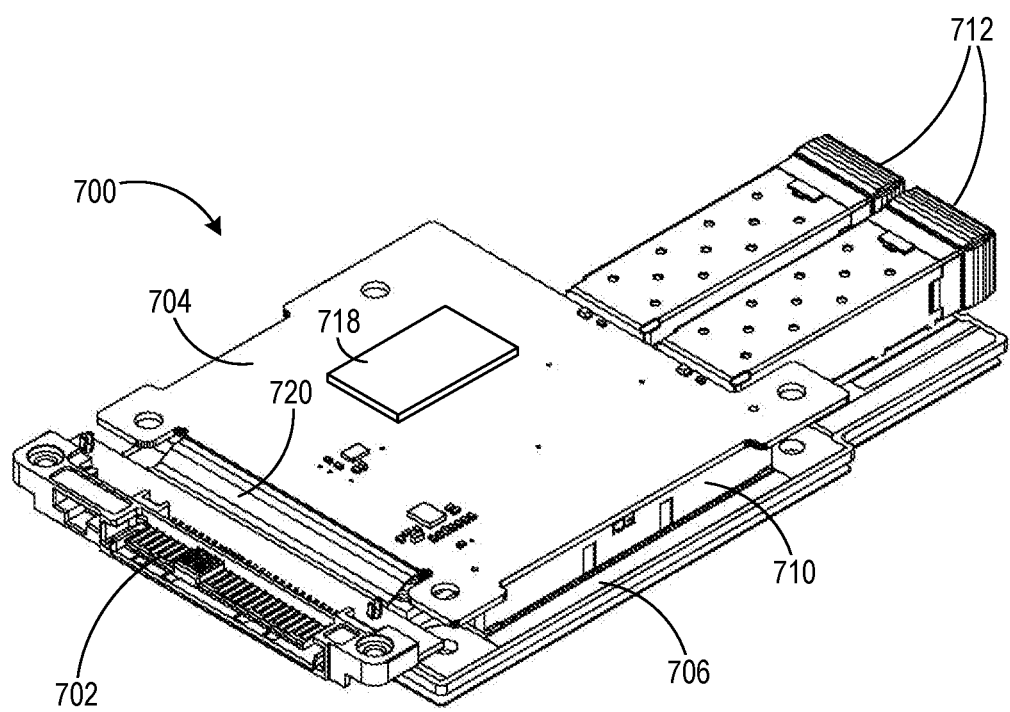
FIG. 7 illustrates an example network module implementation according to some embodiments.
Figure 8:
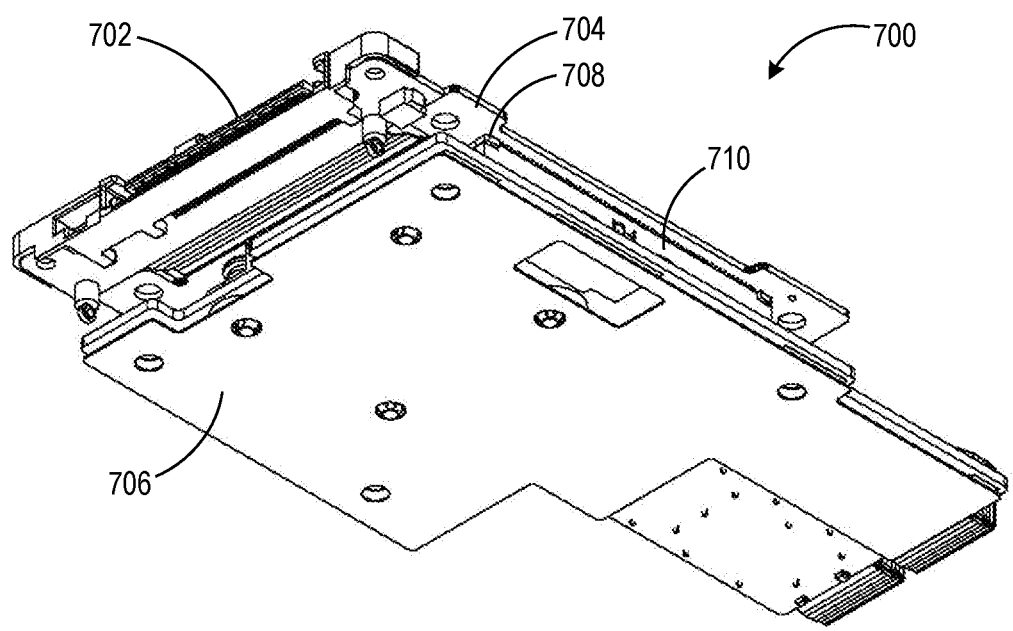
FIG. 8 illustrates an example network module implementation according to some embodiments.

FIGS. 7 through 13 illustrate a network solution according to an embodiment. Referring to FIGS. 7 and 8, an example of carrier assembly 600 includes a network card module or assembly 700 includes a U.2 connector 702 that allows the network card module 700 to be connected to a host connector typically associated with hard drives. Accordingly, an improvement benefit of embodiments of the disclosure include connecting a network card module 700, which provides network capabilities, into slots or locations previously unavailable to network cards.

Network card module 700 includes two circuit boards 704, 706. To join circuit boards 704, 706 together for transferring or sharing of communications, power, and other signals, two respective connectors 708, 710 are provided. Circuit board 706 is a NIC card and includes network cable connectors 712 and network circuitry 714 thermally coupled to a heat sink 716. Circuit board 704 is a connector card includes hot-swap circuitry 718 configured to allow the network card module 700 to be hot-swapped into and out of a computer system. That is, hot-swap circuitry 718 provides the ability of network card assembly 700 be added or replaced in a running system without stopping or shutting the system down benefiting from the network card assembly 700. U.2 connector 702 is electrically connected to circuit board 704 via a flexible or flex circuit 720, allowing U.2 connector 702 to be properly positioned with regard to the host connector in consideration of the stack-up of circuit boards 704, 706.

Figure 9:
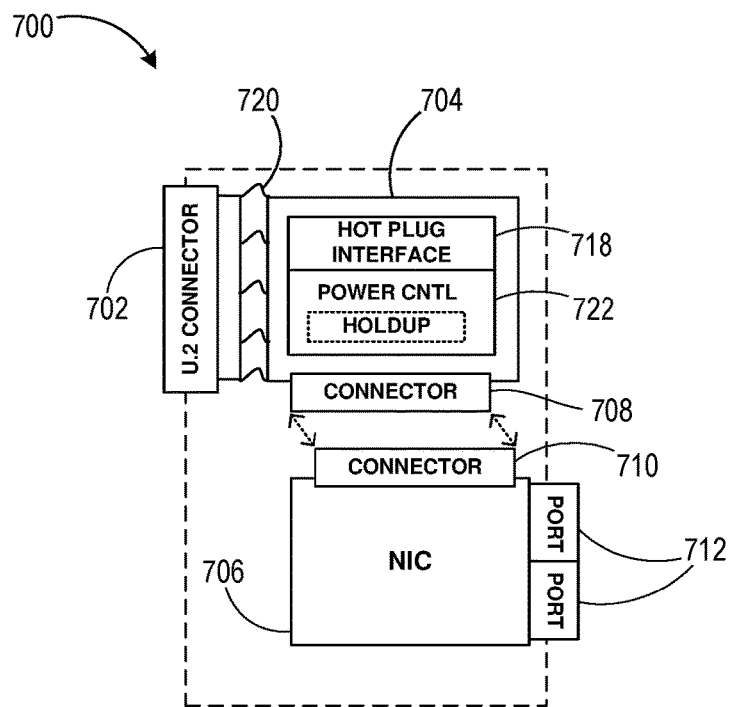
FIG. 9 is a block diagram of network card module according to some embodiments.

FIG. 9 is a block diagram of network card module 700 in an implementation. Network card module 700 comprises NIC elements such as transceivers, transformers, isolation circuitry, buffers, and the like. Network card module 700 might comprise Gigabit Ethernet interface circuitry that can carry Ethernet traffic, along with any associated Internet protocol (IP) and transmission control protocol (TCP) traffic, among other network communication formats and protocols. Network card module 700 couples to circuit board 704 via connectors 708, 710.

Network card module 700 can include a power control module 722 that receives source input power over associated input power links of connector 702 and converts/conditions the input power for use by the elements of the associated module. Power control module 722 distributes power to each element of the associated module over associated power links. Power control module 722 includes circuitry to selectively and individually provide power to any of the elements of the associated module. Power control module 722 can receive control instructions from an optional control processor over an associated PCIe link or sideband link (not shown in FIG. 9 for clarity). Power control module 722 can include various power supply electronics, such as power regulators, step up converters, step down converters, buck-boost converters, power factor correction circuits, among other power electronics. Various magnetic, solid state, and other electronic components are typically sized according to the maximum power draw for a particular application, and these components are affixed to an associated circuit board.

A holdup circuit 724 includes energy storage devices for storing power received over power links for use during power interruption events, such as loss of input power. Holdup circuit 724 can include capacitance storage devices, such as an array of capacitors, among other energy storage devices such as those shown in capacitor array 134 shown in FIG. 2. Excess or remaining holdup power can be held for future use, bled off into dummy loads, or redistributed to other devices over PCIe power links or other power links.

Figure 10:
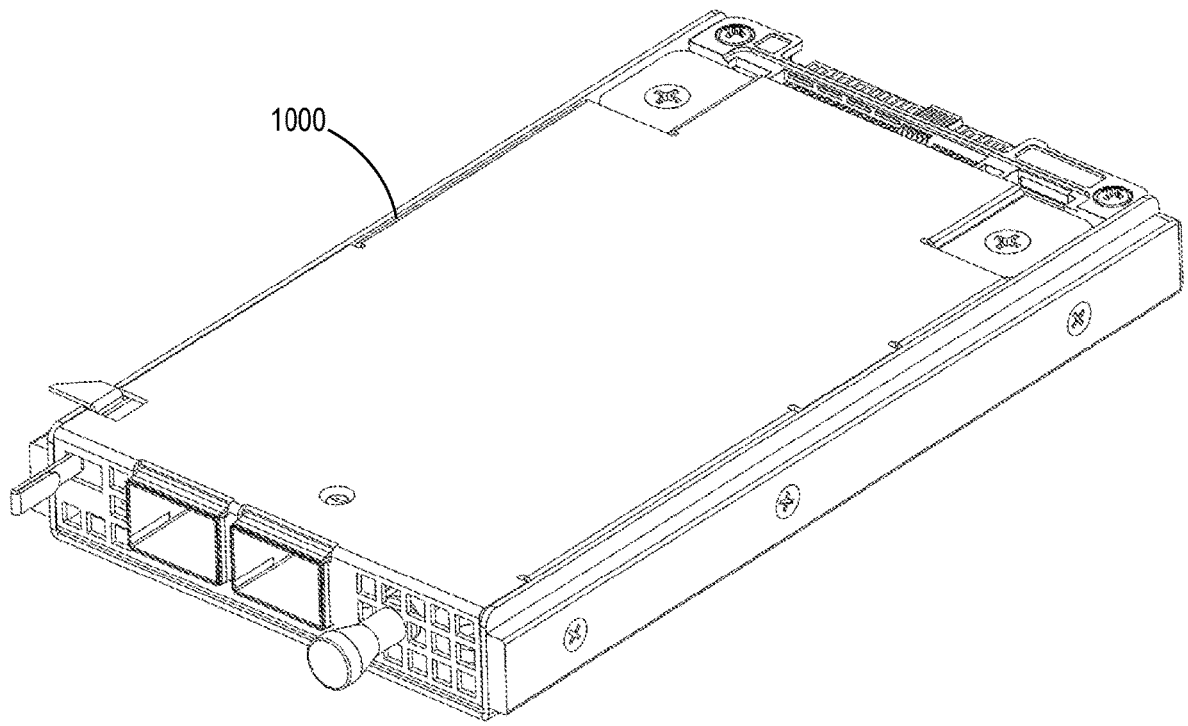
FIG. 10 illustrates an example carrier assembly housing for a network module implementation according to some embodiments.
Figure 11:
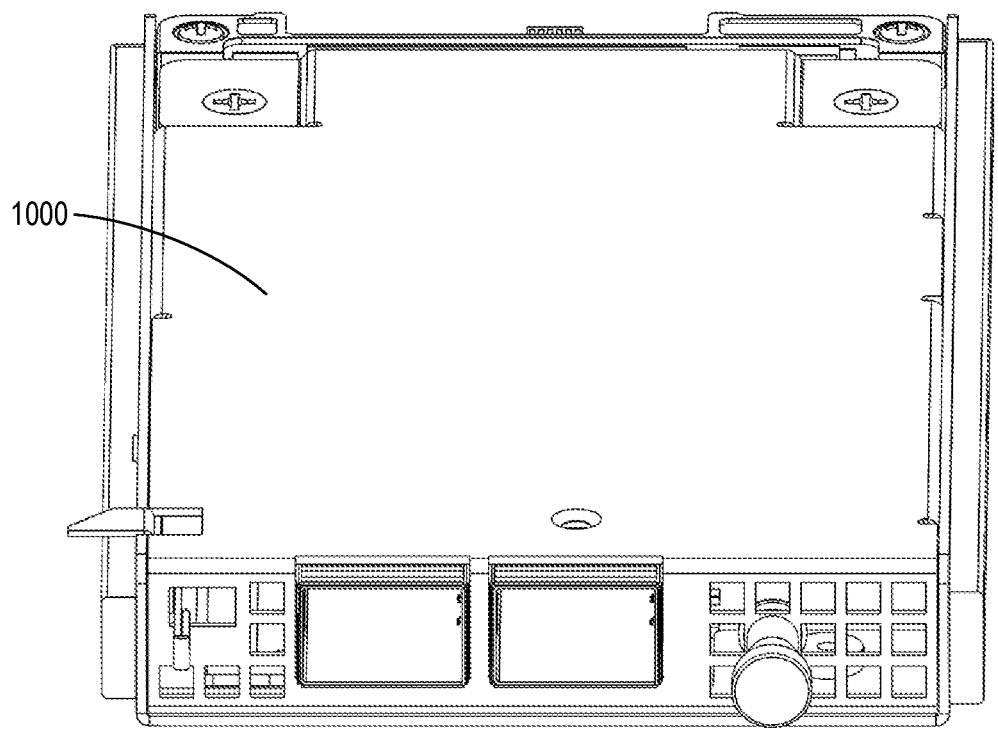
FIG. 11 illustrates an example carrier assembly housing for a network module implementation according to some embodiments.
Figure 12:
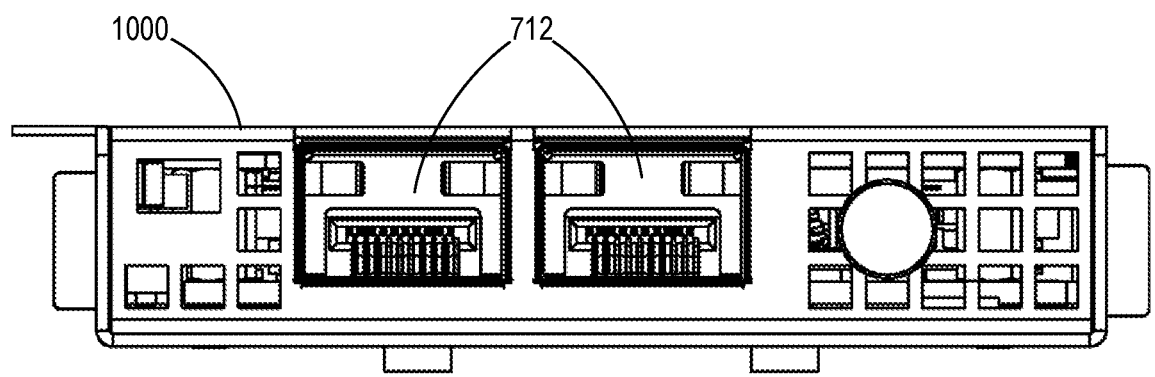
FIG. 12 illustrates an example carrier assembly housing for a network module implementation according to some embodiments.
Figure 13:
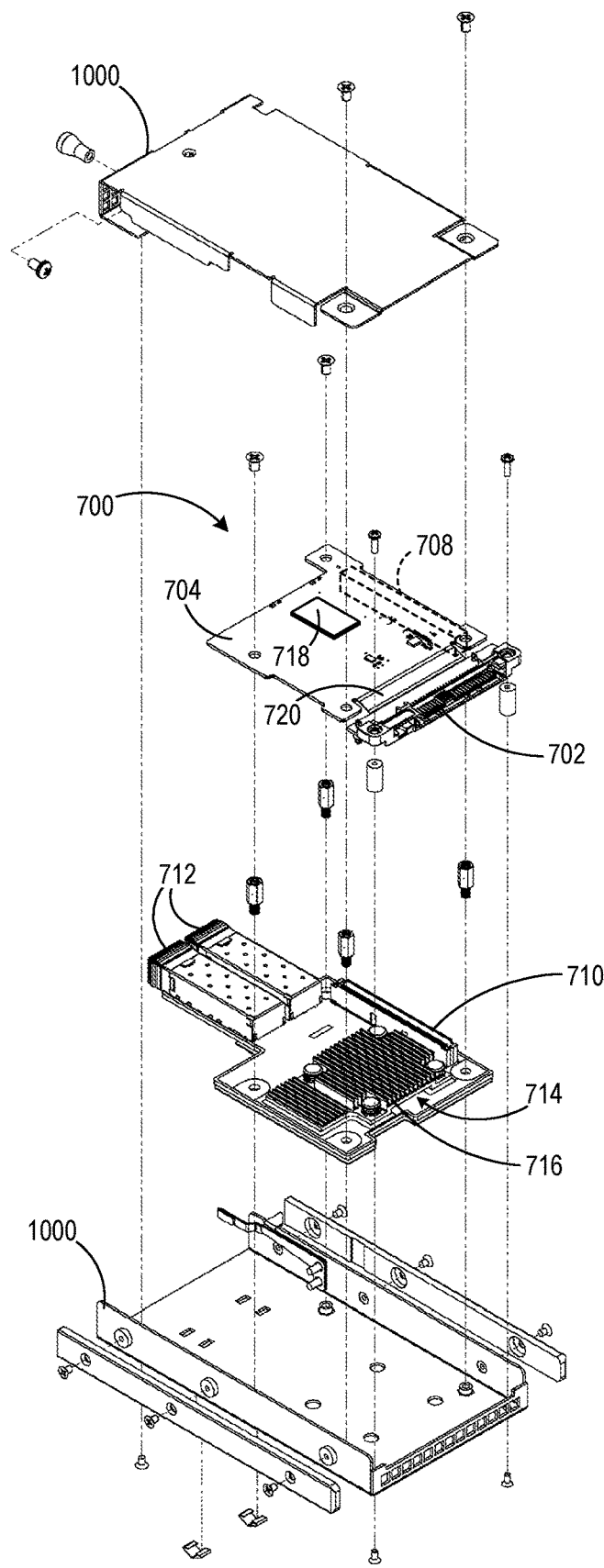
FIG. 13 illustrates an exploded view of an example carrier assembly housing with a network module implementation according to some embodiments.

FIGS. 10-12 illustrate a 2 U carrier assembly 1000 into which network card assembly 700 may be housed. In an example prior art scenario, carrier assembly 1000 typically houses a hard drive. An improvement provided by embodiments of the disclosure allow the network card assembly 700 to be used in slots typically used for hard drives. An exploded view of carrier assembly 1000 and network card assembly 700 is illustrated in FIG. 13.

FIG. 14 illustrates a block diagram of circuitry and other elements of storage device 1400. Storage device 1400 can comprise one example implementation of storage devices in FIGS. 1-5, although variations are possible. Storage device 1400 includes at least four storage drives 1402, PCIe switch 1404, processor 1406, power control module 1408, and holdup circuit 1410. Power control module 1408 distributes power to each element of storage device 1400 over associated power links 1412-1414. Power control module 1408 can selectively enable/disable power for each power link. Further communication links can be included for intra-card communication between the various elements of storage device 1400.

Signals/power can be carried over a single host connector, such as a U.2 connector discussed herein, or can be carried over a host connector in conjunction with a power connector and one or more auxiliary connectors. In one example, power link 1416, sideband links 1418, and host PCIe interface 1420 are all included in a U.2 host connector. Auxiliary PCIe links 1422 might be included in the same connector, or a separate connector. Also, sideband links 1418 might be split among more than one connector.

Storage device 1400 includes one or more storage drives 1402, such as at least four each shown in FIG. 14. Storage device 1400 also includes one or more Peripheral Component Interconnect Express (PCIe) switches, processors, and control system elements. PCIe switch 1404 communicates with one or more on-device storage drives over associated PCIe links. PCIe switch 1404 is also communicatively coupled to an on-device processor or control system for traffic statistics retrieval, power monitoring, status monitoring, among other operations.

PCIe switch 1404 communicates with a host system or host module (not pictured) over PCIe link 1420. PCIe link 1420 comprises a PCIe link with at least four lanes, namely a "×4" PCIe link, although a different number of PCIe lanes can be employed. Additionally, more than one PCIe link 1420 can be employed for load balancing, redundancy, and failover protection for storage device 1400, such as shown for auxiliary PCIe interface 1422. PCIe switch 1404 also communicates with at least four storage drives 1402 over associated ×4 PCIe links 1424. PCIe can support multiple bus widths, such as ×1, ×4, ×8, ×16, and ×32, with each multiple of bus width comprising an additional "lane" for data transfer. PCIe also supports transfer of sideband signaling, such as System Management Bus (SMBus) interfaces and Joint Test Action Group (JTAG) interfaces, as well as associated clocks, power, and bootstrapping, among other signaling.

PCIe interface 1420 can carry NVMe (NVM Express) traffic issued by a host processor or host system. NVMe (NVM Express) is an interface standard for mass storage devices, such as hard disk drives and solid-state memory devices. NVMe can supplant serial ATA (SATA) interfaces for interfacing with mass storage devices in personal computers and server environments. However, these NVMe interfaces are limited to one-to-one host-drive relationship, similar to SATA devices. In the examples discussed herein, a PCIe interface is employed to transport NVMe traffic and present a multi-drive system comprising storage drives 1402 as one or more NVMe virtual logical unit numbers (VLUNs) over a PCIe interface.

In NVMe operations, such as an NVMe write operation, data can be received over any of PCIe links 1420 or 1422 for any storage drive 1402. For example, a write operation can be an NVMe write operation received over PCIe link 1420 from a device employing an NVMe protocol transported over a PCIe interface. In another example, the write operation can be an NVMe write operation received over PCIe link 1420 or 1422 from an external device employing an NVMe protocol transported over a PCIe interface. An associated storage drive can receive the NVMe traffic over an associated PCIe interface 1424 and respond accordingly, such as with a write confirmation or with read data in the case of an NVMe read operation.

In further examples, processor 1406 can handle PCIe traffic for the storage drives and manage the storage drives in a logical manner. For example, data striping can be employed by processor 1406 to stripe data for a particular write transaction over any number of storage drives 1402, such as over all of the storage drives or a subset of the storage drives. Likewise, data redundancy can be employed to mirror data over any of storage drives 1402. In further examples, ones of storage drives 1402 are presented as one or more logical drives or logical volumes to a host system, such as one or more NVMe virtual logical units (VLUNs). Processor 1406 can manage striping, mirroring, or logical volume establishment and presentation. In a first example, processor 1406 receives all PCIe traffic for storage drives 1402 over PCIe interface 1426 and distributes to appropriate storage drives 1402 to achieve striping, mirroring, or logical volumes. In other examples, processor 1406 monitors traffic in PCIe switch 1404 and instructs PCIe switch 1404 to direct PCIe traffic to appropriate storage drives to achieve striping, mirroring, or logical volumes.

As mentioned above, processor 1406 can present the storage resources of storage device 1400 as a VLUN, such as NVMe VLUNs. Processor 1406 can present any number of VLUNs to an external system over a PCIe interface, such as any of PCIe links 1420 or 1422. These VLUNs can be presented as an NVMe target. An NVMe target can present the storage resources of storage device 1400 as a single storage target, such as emulating a single storage drive, over a PCIe interface. In this manner, a plurality of storage drives that comprise any number of storage drives 1402 can be presented as a single NVMe target to an external system over a PCIe interface. Processor 1406 can receive NVMe storage traffic, such as NVMe frames, and distribute these storage transactions for handling by an assigned storage drive 1402. In other examples, processor 1406 monitors NVMe storage traffic in PCIe switch 1404 and instructs PCIe switch 1404 to direct PCIe traffic to appropriate storage drives to achieve VLUNs or NVMe targets.

Auxiliary PCIe interface 1422 can optionally be included in storage device 1400. Auxiliary PCIe interface 1422 can be employed to connect two or more PCIe storage devices to each other for transfer of user data, storage operations, status, control signaling, operational information, or other data between storage devices, such as two of storage device 1400. Auxiliary PCIe interface 1422 can be employed to connect storage device 1400 to more than one host system, such as to two host systems simultaneously. Auxiliary PCIe interface 1422 can comprise a different PCIe bus width or lane allocation than host PCIe interface 1420. Signaling for auxiliary PCIe interface 1422 can be included in a same physical connector as PCIe interface 1420 (such as a U.2 connector) or can be included in a separate connector than that of PCIe interface 1420. In some examples, mini-SAS connectors and cabling are employed and are configured to carry PCIe signaling of auxiliary PCIe interface 1422. Auxiliary PCIe interface 1422 can also include non-PCIe signaling, such as sideband interfaces 1418 or other interfaces. Auxiliary PCIe interface 1422 can be used for cluster interconnect and can terminate at external connectors, such as mini-Serial Attached SCSI (SAS) connectors which are employed to carry PCIe signaling over mini-SAS cabling. In further examples, MiniSAS HD cables are employed that drive 12 Gb/s versus 6 Gb/s of standard SAS cables. 12 Gb/s can support PCIe Gen 3. A connector for auxiliary PCIe interface 1422 can comprise mini-SAS connectors that comprise mini-SAS jacks. Associated cabling can comprise SAS cabling which can include associated shielding, wiring, sheathing, and termination connectors.

PCIe switch 1404 comprises one or more PCIe crosspoint switches, which logically interconnect various ones of the associated PCIe links based at least on the traffic carried by each PCIe link. PCIe switch 1404 establishes switched connections between any PCIe interfaces handled by PCIe switch 1404. Each PCIe switch port can comprise a non-transparent (NT) or transparent port. An NT port can allow some logical isolation between endpoints, while a transparent port does not allow logical isolation, and has the effect of connecting endpoints in a purely switched configuration. Access over an NT port or ports can include additional handshaking between the PCIe switch and the initiating endpoint to select a particular NT port or to allow visibility through the NT port. In other examples, a logical domain-based PCIe signaling distribution can be included which allows segregation of PCIe ports of a PCIe switch according to user-defined logical groups. In some examples, PCIe switch 1404 comprises a PLX Technology PEX8725 10-port, 24 lane PCIe switch chip. In some examples, PCIe switch 1404 comprises a PLX Technology PEX8796 24-port, 96 lane PCIe switch chip.

Although PCIe link 1420 is used in FIG. 14, it should be understood that additional or different communication links or busses can be employed, such as Ethernet, Serial Attached SCSI (SAS), FibreChannel, Thunderbolt, Serial Attached ATA Express (SATA Express), among other interconnect, network, and link interfaces. Any of the links in FIG. 14 can each use various communication media, such as air, space, metal, optical fiber, or some other signal propagation path, including combinations thereof. Any of the PCIe links in FIG. 14 can include any number of PCIe links or lane configurations. Any of the links in FIG. 14 can each be a direct link or might include various equipment, intermediate components, systems, and networks. Any of the links in FIG. 14 can each be a common link, shared link, aggregated link, or may be comprised of discrete, separate links.

Processor 1406 can optionally communicate over at least sideband links 1418. In some examples, sideband links are provided over connector 136 of FIGS. 1-3. Sideband links 1418 can include Universal Serial Bus (USB), SMBus, JTAG, Inter-Integrated Circuit (I2C), controller area network bus (CAN), or any other communication interface, and in some examples is provided over portions of PCIe link 1420. In this example, processor 1406 includes I2C interface 1428 and USB interface 1430 for communication over sideband links 1418. I2C interface 1428 and USB interface 1430 can be included in separate circuitry or included in similar elements as processor 1406. Processor 1406 and PCIe switch 1404 can communicate over an associated communication link 1426, which can be an I2C or a PCIe link, among other link types.

Each storage drive 1402 comprises a solid-state drive (SSD) in this example, and communicates with systems external to the SSD over an associated PCIe interface included in each storage drive 1402. Each storage drive 1402 can comprise an individual M.2 SSD card, which communicates over an associated PCIe interface 1424, which can comprise PCIe interfaces such as described for PCIe interface 1420, although variations are possible. The solid-state storage media of storage drives 1402 can comprise flash memory, static RAM, NAND flash memory, NOR flash memory, memristors, or other solid-state media. Instead of or in addition to solid-state media, each storage drive 1402 can comprise magnetic storage, such as hard disk drives, tape drives, magnetoresistive memory devices, or resistive memory devices, and the like, or can comprise optical storage, which might include phase change memory.

Each storage drive 1402 can receive read transactions and write transactions issued by a host system, such as a host processor. Responsive to a read transaction, each storage drive 1402 can retrieve data identified by the read transaction and transfer the data for delivery to the associated host. Responsive to a write transaction, each storage drive 1402 can write data that accompanies the write transaction to storage media associated with storage drive 1402. Data striping can be employed by storage device 1400 to stripe data for a particular write transaction over any number of storage drives 1402. Each storage drive 1402 can handle physical management of the associated storage media, such as storage medium-level read/writes and wear-leveling when flash memory is employed.

Processor 1406 comprises one or more microprocessors, processing devices, multi-core processors, processing circuitry, or other processing system. Processor 1406 can include one or more non-transitory memory devices, such as RAM, solid-state storage, or other memory to store instructions that are executable by processor 1406 to operate as discussed herein. In some examples, processor 1406 comprises an ARM microcontroller, ARM microprocessor, field-programmable gate array (FPGA), application specific integrated circuit (ASIC), application specific processor, or other microprocessor or processing elements. Processor 1406 can comprise any processing elements discussed below for processing system 1600 of FIG. 16. Processor 1406 can monitor usage statistics, traffic status, or other usage information through link 1426. PCIe switch 1404 can track this usage information during normal operation and data transfer with storage drives 1402, and processor 1406 can retrieve this usage information as needed over link 1426.

Holdup circuitry 1410 is included on storage device 1400 to provide power to the storage device when input power has been lost or removed for the storage device. In some examples, the storage device is removed from an associated mating connector and input power is lost due to the removal. In other examples, power is lost to a host system into which storage device 1400 is connected, such as during a facility power outage or when an associated power supply fails.

The various holdup circuitry is also accompanied by a power controller circuit 1408 to selectively provide power to the elements of storage device 1400. The power controller can receive control instructions from a processor of storage device 1400 or from other processors or modules, such as over the Inter-Integrated Circuit (I2C), Ethernet, or Universal Serial Bus (USB) sideband interfaces, or over a PCIe interface. Storage device 1400 can receive power over one or more power links as a power source for the various elements of storage device 1400, and these power links can be included in a PCIe connector of storage device 1400. Holdup circuitry 1410 includes energy storage devices for storing power received over the power link for use during power interruption events, such as loss of source power. Holdup circuitry 1410 can include capacitance storage devices, such as an array of capacitors. Further discussion of examples of power control circuitry is found below.

Although processor 1406 and power controller 1408 are shown as separate elements in FIG. 14, it should be understood that processor 1406 and power controller 1408 can be included in the same processing circuitry. In some examples, processor 1406 and power controller 1408 comprise an ARM-compatible microprocessor or microcontroller, although other circuitry can be employed.

Storage device 1400 can provide self-power (holdup power) during power interruption events. Typically, storage device 1400 will use any associated holdup power to commit in-flight write data associated with pending write operations before power down of circuitry of storage device 1400. The in-flight write data can be committed to associated storage drives 1402, or can be committed to other non-volatile memory such as a non-volatile write cache which can hold write data until power is restored. Once any in-flight write data has been committed to non-volatile memory, then excess or remaining holdup power can be held for future use, bled off into dummy loads, or redistributed to other devices over PCIe power links or other power links.

In some examples, no pending write operations are present when input power is lost, and a larger amount of excess power is available on storage device 1400. This excess power can be redistributed to a different storage device to aid that storage device in commit processes for associated write operations. Advantageously, excess holdup power of one storage device can be used to power operations of another storage device during power interruptions. This redistributed power can be transferred to other storage devices or other PCIe devices over power links included in the PCIe interface connectors.

Power control module 1408 includes circuitry to selectively provide power to any of the elements of storage device 1400. Power control module 1408 can receive control instructions from processor 1406 or over PCIe link 1420. In some examples, power control module 1408 comprises processing elements discussed above for processor 1406, or is included in the elements of processor 1406. Power control module 1408 can receive power over power link 1416 as a power source for the various elements of storage device 1400. Holdup circuit 1410 includes energy storage devices for storing power received over power link 1416 for use during power interruption events, such as loss of source power. Holdup circuit 1410 can include capacitance storage devices, such as an array of capacitors. Further discussion of examples of power control circuitry is found below.

In some examples, bidirectional power flow is possible over link 1416. Power can be accepted by storage device 1400 when input power is available, such as from a mating connector. Power can be redistributed to other storage devices by module 1400 over link 1416 when input power is not available, such as during power interruption events. When storage device 1400 is removed from a mating connector, then power can be bled off into associated power sink circuitry. Although one power link 1416 is shown, it should be understood that more than one link can be included, such as separate input and output links or separate links for different voltage levels.

Figure 15:
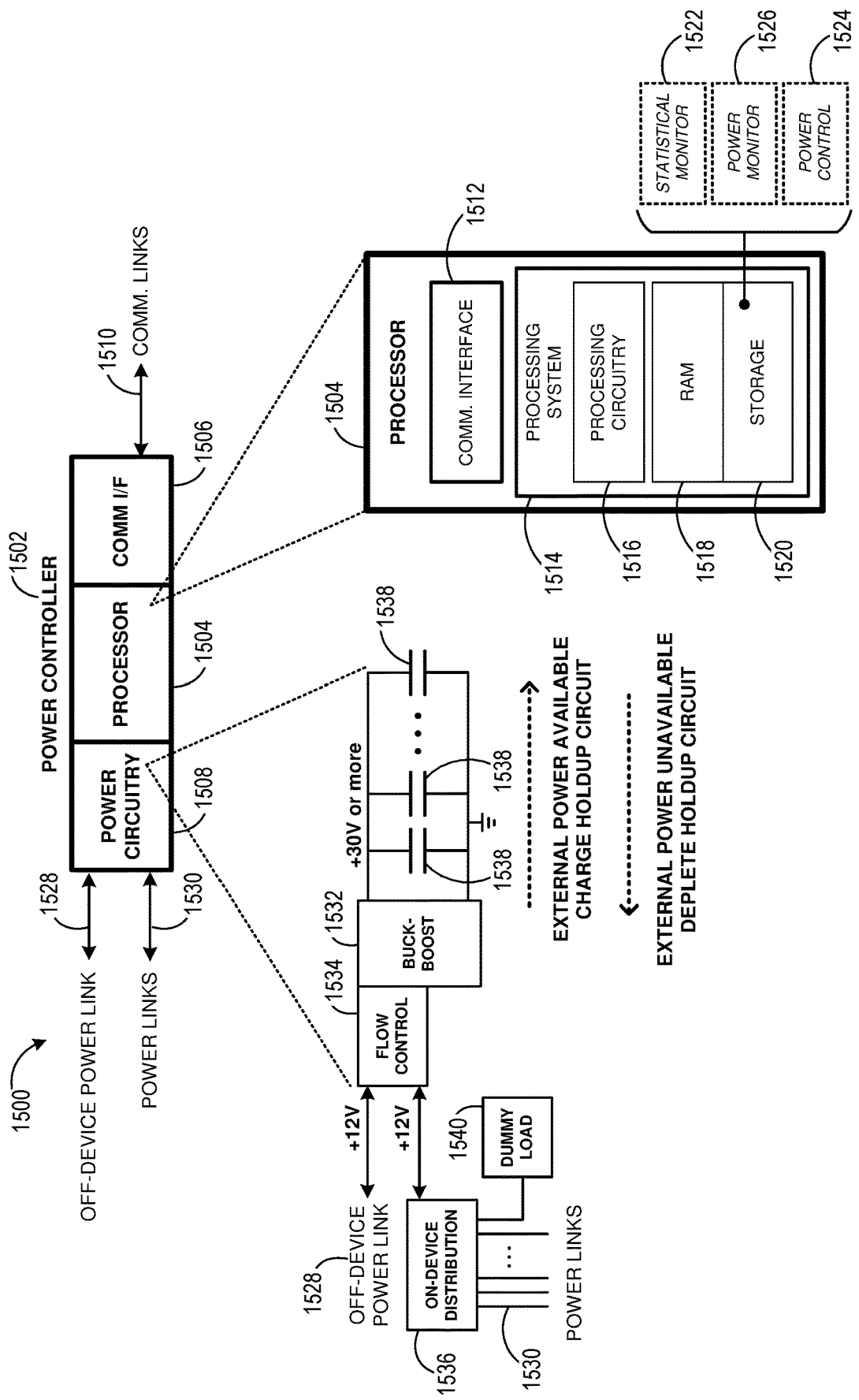
FIG. 15 illustrates an example control system in an implementation.

FIG. 15 is a block diagram illustrating power control system 1500. Power control system 1500 can be included on any of the storage devices discussed herein, such as the power controller or holdup circuitry portions of storage device 100 of FIG. 1, or storage device 1400 of FIG. 14, among others. Power control system 1500 illustrates power controller 1502, which can be an example of any of the power control modules or processor discussed herein, such as power control module 1408 or processor 1406 of FIG. 14. Power controller 1502 includes processor 1504, communication interface 1506, and power circuitry 1508. Each of the elements of power controller 1502 are communicatively coupled.

Communication interface 1506 communicates over communication links 1510, which can include any of the communication link protocols and types discussed herein. Communication interface 1506 can include transceivers, network interface equipment, bus interface equipment, and the like. In operation, communication interface 1506 receives control instructions from another processing unit over communication links 1510. Communication links 1510 also communicate with elements of the device that power controller 1502 is employed on. For example, on a storage device, communication links 1510 receive write data commit status of storage drives, power control instructions from other processors or processing systems, and can communicate over a PCIe interface or sideband communications of a PCIe interface.

Processor 1504 includes any processor or processing system discussed herein, and controls the operations of power controller 1502, such as initiating power up of storage device elements, initiating power down of storage device elements, monitoring usage statistics for a storage device or for other storage devices.

To further describe the circuitry and operation of processor 1504, a detailed view is provided, although variations are possible. Processor 1504 includes communication interface 1512 and processing system 1514. Processing system 1514 includes processing circuitry 1516, random access memory (RAM) 1518, and storage 1520, although further elements can be included. Example contents of storage 1520 are further detailed by software modules 1522-1524.

Processing circuitry 1516 can be implemented within a single processing device but can also be distributed across multiple processing devices or sub-systems that cooperate in executing program instructions. Examples of processing circuitry 1516 include general purpose central processing units, microprocessors, application specific processors, and logic devices, as well as any other type of processing device. In some examples, processing circuitry 1516 includes physically distributed processing devices, such as cloud computing systems.

Communication interface 1512 includes one or more communication and network interfaces for communicating over communication networks or discrete links, such as communication interface 1506, or further serial links, packet networks, the Internet, and the like. The communication interfaces can include one or more local or wide area network communication interfaces which can communicate over Ethernet or Internet protocol (IP) links. Communication interface 1512 can include network interfaces configured to communicate using one or more network addresses, which can be associated with different network links. Examples of communication interface 1512 include network interface card equipment, transceivers, modems, and other communication circuitry. Although communication interface 1512 and communication interface 1506 are both shown in FIG. 15, it should be understood that these can comprise different interfaces or combined into the same communication interface module, and can communicate over links 1510.

RAM 1518 and storage 1520 together can comprise a non-transitory data storage system, although variations are possible. RAM 1518 and storage 1520 can each comprise any storage media readable by processing circuitry 1516 and capable of storing software. RAM 1518 can include volatile and nonvolatile, removable and non-removable media implemented in any method or technology for storage of information, such as computer readable instructions, data structures, program modules, or other data. Storage 1520 can include non-volatile storage media, such as solid-state storage media, flash memory, phase change memory, or magnetic memory, including combinations thereof. RAM 1518 and storage 1520 can each be implemented as a single storage device but can also be implemented across multiple storage devices or sub-systems. RAM 1518 and storage 1520 can each comprise additional elements, such as controllers, capable of communicating with processing circuitry 1516.

Software stored on or in RAM 1518 or storage 1520 can comprise computer program instructions, firmware, or some other form of machine-readable processing instructions having processes that when executed a processing system direct processor 1504 to operate as described herein. For example, software drives processor 1504 to monitor operating statistics and status for a storage device, monitor power status for the cards and modules, and instruct power circuitry 1508 to control flow of holdup power or operational power, among other operations. The software can also include user software applications. The software can be implemented as a single application or as multiple applications. In general, the software can, when loaded into a processing system and executed, transform the processing system from a general-purpose device into a special-purpose device customized as described herein.

Software modules 1522-1524 each comprise executable instructions which can be executed by processor 1504 for operating power controller 1502 according to the operations discussed herein. Specifically, statistical monitor 1522 monitors usage status or usage statistics for elements of a storage device. The usage statistics include data transfer rates of links, error rates of links, a cumulate number of errors of links, among other statistics. The usage statistics can be collected and stored by processor 1504 in a data structure, such as a database or table and stored in storage 1520, RAM 1518, or other storage elements. Power monitor 1526 monitors power inrush statistics during a power-up process, power status statistics, power active status, voltage levels, phase measurements, current draw, holdup circuit status or levels, card/module insertion status, thermal levels, among other statistics. Power control 1524 instructs power circuitry to power up or power down an associated storage device or module responsive to statistical monitor 1522 or power monitor 1526, among other signals such as discrete signals monitored by power circuitry 1508. Power control 1524 can power up or power down a card or module responsive to data commit status of associated storage drives or other circuitry, responsive to insertion status, or other factors.

Software modules 1522-1524 can reside in RAM 1518 during execution and operation by processor 1504, and can reside in storage space 1520 during a powered-off state, among other locations and states. Software modules 1522-1524 can be loaded into RAM 1518 during a startup or boot procedure as described for computer operating systems and applications.

Storage 1520 can include one or more storage systems comprising flash memory such as NAND flash or NOR flash memory, phase change memory, magnetic memory, among other solid-state storage technologies. As shown in FIG. 15, storage 1520 includes software modules 1522-1524 stored therein. As described above, storage 1520 can store software modules 1522-1524 in one or more non-volatile storage spaces during a powered-down state of processor 1504, among other operating software, such as operating systems.

Processor 1504 is generally intended to represent a computing system where at least software modules 1522-1524 are deployed and executed in order to render or otherwise implement the operations described herein. However, processor 1504 can also represent any computing system on which at least software modules 1522-1524 can be staged and from where software modules 1522-1524 can be distributed, transported, downloaded, or otherwise provided to yet another computing system for deployment and execution, or yet additional distribution.

Power circuitry 1508 includes various power control, voltage regulation, power holdup, and other circuitry. Power circuitry 1508 receives power from a power source, such as off-device power link 1528, and distributes power to on-device elements over ones of power links 1530.

As a specific example of power circuitry 1508, various elements are shown in FIG. 15. These elements include buck-boost module 1532, flow control module 1534, on-device distribution module 1536, holdup capacitors 1538, and dummy load 1540. Buck-boost module 1532 comprises one or more switching power regulators that receive power from a power source, such as off-device power link 1528, and boosts a voltage associated with the power source to a holdup voltage for holdup capacitors 1538. In this example, the power source is provided at +12 VDC and the holdup capacitors 1538 are driven at a higher voltage, such as over +30 VDC, although different voltages can be employed, such as 80 VDC, 125 VDC, or higher voltages on holdup capacitors 1538. Buck-boost module 1532 can also take the energy stored by holdup capacitors 1538 and step-down the voltage to a lower voltage, such as 12 VDC for driving on-device or off-device elements using the energy stored in holdup capacitors 1538. Processor 1504 can communicate with buck-boost 1532 to instruct buck-boost 1532 to enter a buck mode or a boost mode. Buck-boost 1532 can receive control signals or instructions from processor 1504, such as over general purpose I/O of processor 1504.

To control the flow of energy between on-device power and holdup power, flow control module 1534 is employed. Flow control module 1534 includes various power switching elements, such as transistor switches, analog switches, solid-state switches, diodes, and the like. When external off-device power is available, such as over link 1528, then flow control 1534 can provide this power to on-device distribution module 1536 and to buck-boost module 1532 for charging holdup capacitors 1538. When external off-device power is not available, then flow control 1534 can allow power stored in holdup capacitors 1538 and stepped-down by buck-boost module 1532 to flow to on-device distribution module 1536 instead of off-device power of link 1528. Also, as discussed below, when excess energy remains in holdup capacitors 1538 after an associated storage device of power controller 1502 has had all elements powered down and data committed, then this excess energy can be directed by flow control module 1534 to off-device consumers over link 1528. In this manner, excess energy stored in holdup devices of power controller 1502 can be used to provide power to other cards or devices during a shutdown or commit process. The commit process includes writing any in-flight write data to non-volatile memory. The non-volatile memory can include storage drives of a storage device, or can include separate non-volatile memory dedicated to power-down caching of in-flight data. If the associated storage device of power controller 1502 is instead removed from a chassis or connector, then this excess energy of holdup capacitors 1538 can be safely bled off using dummy load 1540. Flow control module 1534 can receive control signals or instructions from processor 1504, such as over general purpose I/O of processor 1504.

On-device distribution module 1536 includes various power flow and switching circuitry to direct electrical power to various elements of a storage device, such as storage drives, PCIe switches, and the like, over links 1530. Links 1530 can comprise the various power links discussed herein for the various devices. On-device distribution module 1536 includes various power switching elements, such as transistor switches, analog switches, solid-state switches, diodes, and the like. On-device distribution module 1536 can receive control signals or instructions from processor 1504, such as over general purpose I/O of processor 1504.

Dummy load 1540 can include resistive loads, such as heat dissipating electrical elements to bleed off excess energy of a holdup circuit, such as holdup capacitors 1538. In some examples, dummy load 1540 comprises a high-output light emitting diode (LED) which can efficiently bleed off excess energy using the light output of the LED. This LED can also indicate that energy still remains in the holdup circuit, warning a user of a particular storage device that potentially dangerous or damaging voltages and energies might still exist on a storage device. When a card is inserted into a connector, the LED is normally off. However, when a storage device is removed from a connector, then the LED would be instructed to illuminate and indicate that energy was being bled off of the storage device using the LED. When the LED finally turned off, due to insufficient energy remaining on a card, then the operator can know that dangerous or damaging voltages and energies no longer exist on the storage device. If the LED cannot bleed all of the energy quickly enough, then additional resistive elements can be employed in parallel to assist the LED indicator. Cover plates for the various higher voltage elements, such as capacitors, of system 1500 can be employed.

Figure 16:
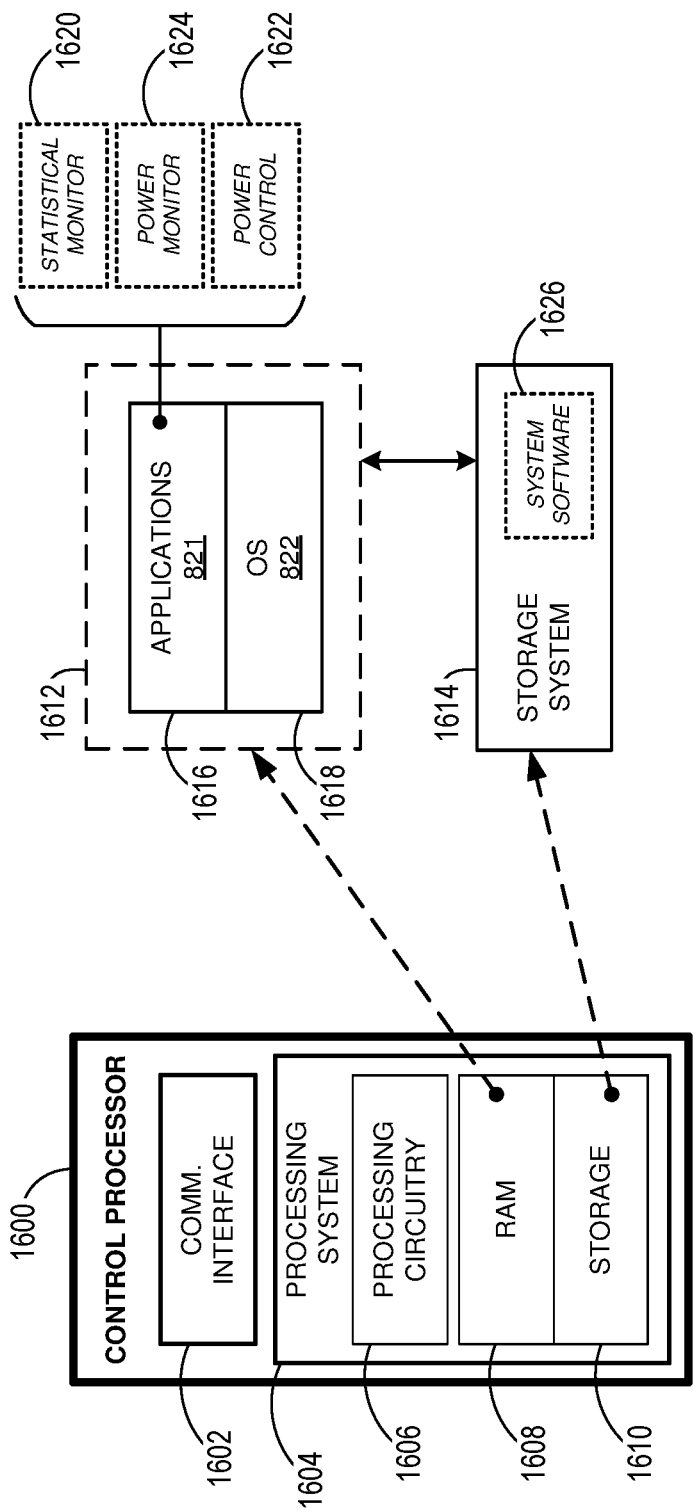
FIG. 16 illustrates an example control system in an implementation.
Figure 17:
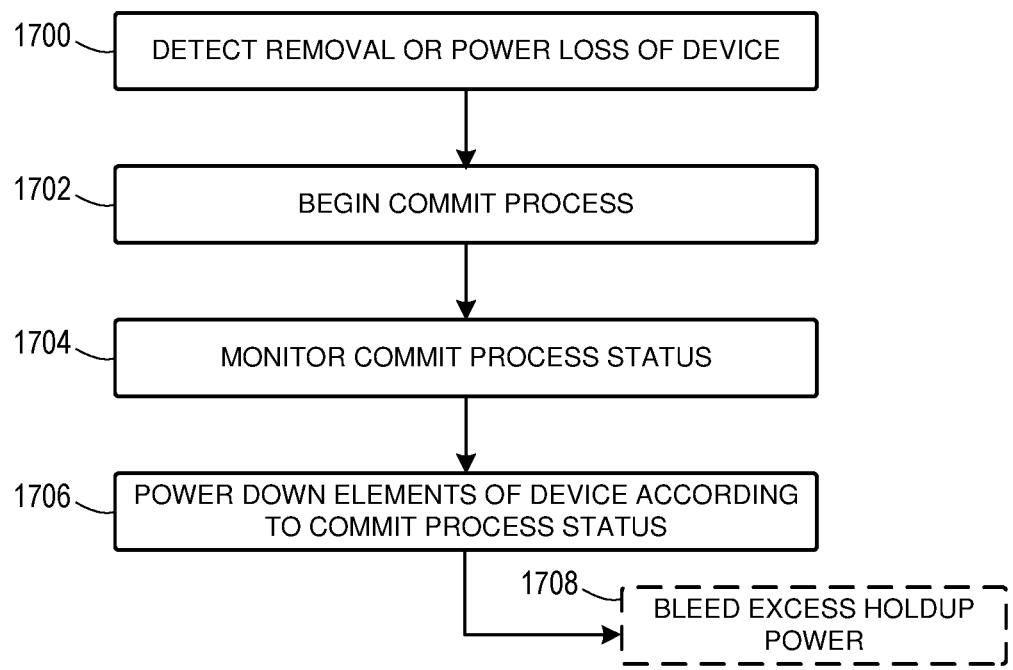
FIG. 17 illustrates an example operation of a control system in an implementation.

To discuss the various power holdup, distribution, and handling operations of FIG. 15 as well as the various power controllers of the devices herein, FIGS. 16-17 are included. FIG. 16 discusses removal of a device from a connector. FIG. 17 discusses the handling of power loss from a device, including from removal.

FIG. 16 is a block diagram illustrating processing system 1600. Processing system 1600 illustrates an example of any of the power control modules or device processors discussed herein, such as power control module 1408 or processor 1406 of FIG. 14, or power controller 1502 of FIG. 15. In addition, processing system 1600 can be illustrative of any processing system a storage device discussed herein.

Control processor 1600 includes communication interface 1602 and processing system 1604. Processing system 1604 includes processing circuitry 1606, random access memory (RAM) 1608, and storage 1610, although further elements can be included. Example contents of RAM 1608 are further detailed in RAM space 1612, and example contents of storage 1610 are further detailed in storage system 1614.

Processing circuitry 1606 can be implemented within a single processing device but can also be distributed across multiple processing devices or sub-systems that cooperate in executing program instructions. Examples of processing circuitry 1606 include general purpose central processing units, microprocessors, application specific processors, and logic devices, as well as any other type of processing device. In some examples, processing circuitry 1606 includes physically distributed processing devices, such as cloud computing systems.

Communication interface 1602 includes one or more communication and network interfaces for communicating over communication links, networks, such as packet networks, the Internet, and the like. The communication interfaces can include PCIe interfaces, serial links, such as SPI links, I2C links, USB links, UART links, or one or more local or wide area network communication interfaces which can communicate over Ethernet or Internet protocol (IP) links. Communication interface 1602 can include network interfaces configured to communicate using one or more network addresses, which can be associated with different network links. Examples of communication interface 1602 include network interface card equipment, transceivers, modems, and other communication circuitry.

RAM 1608 and storage 1610 together can comprise a non-transitory data storage system, although variations are possible. RAM 1608 and storage 1610 can each comprise any storage media readable by processing circuitry 1606 and capable of storing software. RAM 1608 can include volatile and nonvolatile, removable and non-removable media implemented in any method or technology for storage of information, such as computer readable instructions, data structures, program modules, or other data. Storage 1610 can include non-volatile storage media, such as solid-state storage media, flash memory, phase change memory, or magnetic memory, including combinations thereof. RAM 1608 and storage 1610 can each be implemented as a single storage device but can also be implemented across multiple storage devices or sub-systems. RAM 1608 and storage 1610 can each comprise additional elements, such as controllers, capable of communicating with processing circuitry 1606.

Software stored on or in RAM 1608 or storage 1610 can comprise computer program instructions, firmware, or some other form of machine-readable processing instructions having processes that when executed a processing system direct control processor 1600 to operate as described herein. For example, software can drive processor 1600 to monitor operating statistics and status for various storage devices and other modules, monitor power status for the cards and modules, and instruct power circuitry to control flow of holdup power or operational power, control power down or reset of various on-board storage drives, control performance throttling, among other operations. The software can also include user software applications, application programming interfaces (APIs), or user interfaces. The software can be implemented as a single application or as multiple applications. In general, the software can, when loaded into a processing system and executed, transform the processing system from a general-purpose device into a special-purpose device customized as described herein.

RAM space 1612 illustrates a detailed view of an example configuration of RAM 1608. It should be understood that different configurations are possible. RAM space 1612 includes applications 1616 and operating system (OS) 1618. Software applications 1620-1622 each comprise executable instructions which can be executed by processor 1600 for operating a power controller or other circuitry according to the operations discussed herein. Specifically, statistical monitor 1620 monitors usage status or usage statistics for elements of cards and modules. The usage statistics include data transfer rates of links, error rates of links, a cumulate number of errors of links, among other statistics. The usage statistics can be collected and stored by processor 1600 in a data structure, such as a database or table and stored in storage 1610, RAM 1608, or other storage elements. Power monitor 1624 monitors power statistics during a power up, operational, or power-down processes, power status statistics, power active status, voltage levels, phase measurements, current draw, holdup circuit status or levels, card/module insertion status, thermal levels, among other statistics. Power control 1622 instructs power circuitry to power up or power down an associated drive, card, circuitry, or module responsive to statistical monitor 1620 or power monitor 1624, among other signals such as discrete signals monitored by associated power circuitry. Power control 1622 can power up or power down a card or module responsive to data commit status of associated storage drives or other circuitry, responsive to insertion status, or other factors.

Applications 1616 and OS 1618 can reside in RAM space 1612 during execution and operation of control processor 1600, and can reside in storage system 1614 during a powered-off state, among other locations and states. Applications 1616 and OS 1618 can be loaded into RAM space 1612 during a startup or boot procedure as described for computer operating systems and applications.

Storage system 1614 illustrates a detailed view of an example configuration of storage 1610. Storage system 1614 can comprise flash memory such as NAND flash or NOR flash memory, phase change memory, magnetic memory, among other solid-state storage technologies. As shown in FIG. 16, storage system 1614 includes system software 1626. As described above, system software 1626 can be in a non-volatile storage space for applications and OS during a powered-down state of control processor 1600, among other operating software.

Control processor 1600 is generally intended to represent a computing system with which at least software 1626 and 1616-1622 are deployed and executed in order to render or otherwise implement the operations described herein. However, control processor 1600 can also represent any computing system on which at least software 1626 and 1616-1622 can be staged and from where software 1626 and 1616-1622 can be distributed, transported, downloaded, or otherwise provided to yet another computing system for deployment and execution, or yet additional distribution.

FIG. 17 is a flow diagram illustrating a method of operating a storage device. The operations of FIG. 17 are discussed below in an exemplary storage device, such as storage device 1400 of FIG. 14. It should be understood that the operations of FIG. 17 can apply to any of the drives, devices, cards or modules discussed herein, including storage drives, storage cards, and processing modules, among others. Also, the operations of FIG. 17 are discussed in the context of a local processor or power controller, such as the elements of FIGS. 14-16. It should be understood that the operations of FIG. 17 can be handled by a controller, processor, or processing system, such as controller 1408 or processor 1406 of FIG. 14, including combinations and variations thereof.

In FIG. 17, processor 1406 detects (1700) removal of device 1400. This removal can include device 1400 being physically removed from an associated connector. In addition to detecting removal of device 1400, processor 1406 can also detect power loss for a source power, such as provided over power link 1416. Power loss flags or alerts can also be provided over any of sideband link 1418 or PCIe link 1420. In some examples, power loss of link 1416 can be interpreted as a physical removal of device 1400. In other examples, various removal detection methods can be employed, such as pull-down or pull-up pins associated with device 1400 which can indicate physical mating of device 1400 with a socket or connector of an associated connector.

Once removal or power loss is detected, processor 1406 begins (1702) a commit process for device 1400. The commit process ensures that data currently in-flight for storage into any of storage drives 1402 is properly written to an associated storage drive 1402 or to a temporary non-volatile memory of device 1400 during a power hold-up period. Data that has been received over PCIe switch 1404 can be written to the associated storage drive 1402 without loss of that data.

The commit process can include initially powering down PCIe switch 1404 but still providing power to a buffer associated with device 1400 which data in-flight is placed before the data is committed to non-volatile memory, such as ones of storage drive 1402. The buffers can be included in each storage drive 1402, or in separate data buffer components. Processor 1406 monitors (1704) the commit process for each storage drive 1402 and powers down individual ones of storage drives 1402 once all write data has been committed to non-volatile storage of storage drive 1402.

Thus, processor 1406 powers down (1706) elements of device 1400 according to the commit process status. Namely, PCIe switch 1404 is first powered down after power loss is detected, and individual ones of storage drives 1402 are powered down as each completes an associated commit process for buffered write data. Once all write data has been committed to non-volatile memory, processor 1406 can power further elements such as processor 1406 itself or power controller 1408.

During the commit and power down process described above, holdup circuit 1410 provides power to the individual elements of device 1400. Processor 1406 communicates with power controller 1408, such as over link 1412 or another link, and instructs power controller 1408 to selectively enable/disable power for the various elements of device 1400. Power controller 1408 can employ solid-state switches, transmission gates, solid-state analog switches, transistor switches, or other power switching elements to selectively provide or remove power for the various elements of device 1400. Power controller 1408 can also provide an input power status to processor 1406 to indicate when input power is available.

Once input power is regained, such as by re-insertion of device 1400 into a connector or after recovery of a source power, power controller 1408 can apply power to processor 1406. Processor 1406 can proceed through a startup process, such as a boot process, and then instruct power controller 1408 to selectively apply power to the other various elements of device 1400. These various elements of device 1400 can be powered up in a predetermined sequence to reduce inrush current over link 1416. The predetermined sequence can include powering on individual ones of storage drives 1402 in a sequential manner, then powering on PCIe switch, among other sequences.

Once the commit process is complete, processor 1406 can operate in at least two different manners depending upon if the device is removed or not to cause the power loss. When the power loss status is not due to device removal, such as due to loss of source power while the card remains seated in an associated connector, then power controller 1408 might redistribute excess holdup power. Excess power redistribution can occur in systems that support bidirectional PCIe power flow, or in customized systems with power provided separate from a PCIe interface. This excess holdup power comprises energy remaining in any associated holdup circuit, such as holdup capacitors. A flow control circuit can direct energy from the holdup circuit to a link that feeds power off-device. In some examples, such as in FIG. 15, the holdup circuit comprises an array of capacitors which are charged to a higher voltage than desired for an operating voltage of the storage device. In this case, a buck-boost converter can be operated in a step-down mode to convert the high voltage of the holdup capacitors to a lower operating voltage, and a power flow control circuit can direct this energy too off-device destinations or power busses. The redirected power can be used by other storage devices to increase holdup time of the other storage devices to complete shut down operations or data commit operations. A measurement of remaining energy in the holdup circuit can be monitored by processor 1406 and information related to the remaining energy can be provided off-device along with the power itself. In some examples, processor 1406 is also powered down and thus only power flow, voltage step down, and holdup portions of power controller 1408 are active during the power redistribution.

When the power loss is due to storage device removal, then power controller 1408 can bleed (1708) excess power of the holdup circuit. As discussed in FIG. 15, this power bleed can include resistive or LED elements, and ensures that dangerous or damaging energy or high voltage is not remaining on a storage device after removal from a connector.

In further examples, additional power control features can be included. These additional features can include where processor 1406 monitors status of all storage drives 1402 and also optionally monitors usage status or usage statistics for elements of storage device 1400. These elements include any of storage drives 1402, PCIe switch 1404, processor 1406, power control node 1408, holdup circuitry 1410, or any of the various links and communication interfaces. The status and usage statistics include data transfer rates of PCIe links, error rates of PCIe links, retry rates, signal qualities, a cumulate number of errors of PCIe links, storage device insertion status, thermal levels of elements of device 1400, among other statistics, including those statistics received from another storage device or from a host. The status and usage statistics can include inrush statistics provided by power controller 1408, such as during a power-up process or storage device 1400. The status and usage statistics can include power status statistics monitored by power controller 1408, such as a power active status, voltage levels, phase measurements, current draw, holdup circuit status or level, among other statistics. The status and usage statistics can be collected and stored by processor 1406 in a storage system associated with processor 1406, such as RAM, flash memory, or other storage systems. The status and usage statistics can be employed in power down and power up processes such as discussed herein.

Processor 1406 can detect problems with any of storage drives 1402. These problems can be for any of storage drives 1402, and can include lack of response to storage operations or sideband signaling, an error rate above an error threshold, a change in PCIe throughput below a throughput threshold, PCIe retry rates above a threshold level, power loss detected, or other problems. Any of the status or usage statistics can be employed to detect an issue or problem with any of the storage drives. Responsive to detecting a problem with any of the storage drives, processor 1406 can restart elements of storage device 1400. Specifically, processor 1406 can restart ones of storage drives 1402 to attempt to correct or eliminate any problem detected. Additionally, each of storage drives 1402 is isolated on an associated PCIe interface from a host PCIe interface by PCIe switch 1404. Processor 1406 can reset or restart one or more of storage drives 1402 and keep any associated host status unchanged regarding instantiation of the storage drives, a host power status of the storage drives, or factors that might be apparent to a host system or peripheral system into which storage device 1400 is inserted. Thus, the entirety of storage device 1400 does not need to stop normal operation when ones of storage drives 1402 are experiencing problems or issues, such as ones of storage drives 1402 failing to respond to host storage operations or commands.

To restart an individual storage drive, processor 1406 can instruct power controller 1408 to cycle power for the associated storage drive. In other examples, a reset command is issued to the affected storage drive. In yet other examples, a PCIe command is issued to the affected storage drive which commands a reset of that particular storage drive. Processor 1406 can read and store a state or PCIe status information for the affected storage drive and reconfigure that storage drive with the stored state or PCIe status information once reset. The state or PCIe status information can include an identity of the storage drive, an address of the storage drive, a logical unit or logical drive status of the storage drive, among other status, configurations, and information.

During the restart process, any host system which is communicatively coupled to storage device 1400 can be shielded from the restart process so that the host system is not aware of the failure, problem, or associated restart. PCIe switch 1404 can provide some measure of isolation of PCIe interfaces 1424 from PCIe 1420 which is coupled to a host system or peripheral system. Also, during the restart process, storage device 1400 might elect among two or more behaviors when host storage operations are received for the storage drive which is being restarted. In a first example, storage device 1400 might just not respond to storage operations received over PCIe interface 1420 for the storage drive being restarted. This lack of response can force retries in the host system, which can accumulate and eventually cause an error condition in the host system for that particular storage drive. In a second example, one or more buffer circuits can be included on storage device 1400 that can accept storage operations for any of storage drives 1402 while a storage drive is being reset or restarted in-situ. This buffer can be included in any of the other storage drives or in separate storage circuitry, such as non-volatile memory device.

If the reset process fails to resolve the problem with the particular storage drive, then that storage drive can be powered down and/or the associated host system can be notified of a failure or problem with the affected storage drive. Remaining storage drives can continue to operate over associated PCIe interface 1424 and PCIe interface 1420 during the reset/power cycle process for an affected storage drive, and when any particular storage drive fails. Thus, enhanced storage operation can be achieved by having continued operation of storage device 1400 during individual storage drive failures, and those individual drive failures can be resolved by storage device 1400 itself without host system involvement or interruption by using the process described above.

Processor 1406 can monitor usage status or usage statistics for elements of device 1400. These elements include any of storage drive 1402, PCIe switch 1404, processor 1406, power control node 1408, holdup circuitry 1410, or any of the various links and communication interfaces. The usage statistics include data transfer rates of PCIe links, error rates of PCIe links, a cumulative number of errors of PCIe links, storage device insertion status, thermal levels of elements of storage device 1400, among other statistics, including those statistics received from another storage device or a host. The usage statistics can include inrush statistics provided by power controller 1408, such as during a power-up process or storage device 1400. The usage statistics can include power status statistics monitored by power controller 1408, such as a power active status, voltage levels, phase measurements, current draw, holdup circuit status or level, among other statistics. The usage statistics can be collected and stored by processor 1406 in a storage system associated with processor 1406, such as RAM, flash memory, or other storage systems.

Processor 1406 can modify performance of elements of storage device 1400 according to at least the usage statistics. For example, the usage statistics can also be used to control power usage during normal operation of storage device 1400. When usage statistics indicate that a particular storage drive 1402 is dormant or is handling a quantity of transactions that fall below a transaction threshold level, then that storage drive can have an associated operational property modified. This property can include reducing a speed or interface property of a PCIe interface. Processor 1406 can disable a subset of the PCIe lanes of a particular storage drive 1402 to reduce power consumption of that storage device, such as by reducing the number of active lanes from ×4 to ×1. Processor 1406 can reduce a bus speed or clock speed of a PCIe interface of storage drive 1402, such as by reducing a throughput from 8 GB/s to 4 GB/s or 1 GB/s. Other performance scaling can occur based on the usage of elements of storage device 1400 as monitored by processor 1406. A host status can be maintained during the modification of performance of elements of storage device 1400 to prevent action and awareness of fluctuations in storage device performance due to statistically-driven modifications.

Thermal sensors, on-die or on-chip temperature sensors, or discrete thermal measurement circuitry can be employed to monitor thermal status of the elements of storage device 1400. The performance of ones of storage drives 1402 can be increased or decreased on-the-fly according to thermal levels and PCIe switch 1404 can provide a level of abstraction of storage drives 1402 from host PCIe interface 1420. In this manner, a PCIe speed, width, or lane allocation can be altered for any of storage drives 1402 without host system involvement or in-situ by processor 1406.

These usage and performance statistics can be provided to a processing module or host for further collection, storage, and processing. Furthermore, instructions for power up/down and performance scaling can be received from a processing module or host based at least on these provided statistics, among other operations. Additionally, the usage statistics can be employed to selectively power down elements of a particular storage device, such as powering down storage drives 1402 when dormant or when activity levels drop below threshold levels according to the usage statistics. Many components or storage drives incorporate low power modes, such as idle modes. These idle modes can be enabled according to the usage statistics. However, even when in idle or low power modes, these storage drives still consume power. Processor 1406 can monitor when these storage drives, or other storage device elements, fall below a threshold activity level even if in the idle mode, and instruct power control node 1408 to remove power from the associated storage device elements. In some examples, when all storage drives 1402 of a storage device are powered down due to usage statistics for the storage drives falling below a threshold usage level, then any associated PCIe switch on the storage device can also be powered down. Power up of the PCIe switch can occur when usage statistics rise above a threshold usage level, which can be a different usage level than the power down threshold.

In further examples, power control node 1408 can include various power supply electronics, such as power regulators, step up converters, step down converters, buck-boost converters, power factor correction circuits, among other power electronics. Typically, these power electronics must be tuned ahead of time for a particular load application, such as a maximum load anticipated for a particular storage device. Various magnetic, solid-state, and other electronic components are typically sized according to the maximum power draw for a particular application, and these components are permanently affixed to an associated circuit board, such as by soldering or sockets. In FIG. 15, the usage statistics are monitored to establish a present power draw for the various power electronics, such as a current supplied at a certain voltage by a buck-boost converter.

The various parameters of the power electronics can be altered according to the present power loading, such as by selecting among various magnetic components, such as inductors or transformers, adjusting resistive or capacitive components according to the present power loading, and the like. The alterations or adjustments can enable or disable various electronic components, such as using analog switches, low 'on' resistance transistor switches, or other selection methods. The alterations or adjustments can allow for power control node 1408 to operate in a desired efficiency range, such as 90-98% efficiency. As the power load changes due to different usage of the various components of a storage device, the pre-selected electrical components might lead to a lower efficiency. Based on these current usage statistics or power loading, processor 1406 can instruct power control node 1408 to alter component selections, modulation frequencies, pulse-width modulation factors, resistive/capacitive/inductive component usage, among other elements to maintain efficiency of a particular power electronic circuit in the desired efficiency range. These alterations or adjustments can bring phase margins or gain margins of the associated power electronics into the desired ranges. The phase and gain can be monitored by elements of power control node 1408 or processor 1406, including associated circuit elements, such as current sense resistors.

In some examples, the usage statistics, among other factors, are used to modify operating parameters of associated storage device power electronics. However, these modifications might be used only when power loss is detected, to maximize efficient use of holdup circuitry. For example, if holdup capacitors are employed, the voltage provided by the holdup capacitors can drop as energy is drained from the holdup capacitors. As the voltage drops, the efficiency of a buck-boost converter might be reduced as well, since the input voltage provided by the holdup capacitors might fall below a threshold voltage level for efficient use of analog components related to the buck-boost converter. This holdup voltage can be monitored or be used as an input to an efficiency maximization circuit, which alters parameters or components associated with the buck-boost converter to ensure a desired or predetermined efficiency range or level is maintained. Once the voltage drops below a threshold operational level, the buck-boost converter can be disabled to prevent operating within an undesirably low voltage range, such as dictated by input voltage requirements of the particular power electronic components employed.

The descriptions and FIGS. included herein depict specific implementations to teach those skilled in the art how to make and use the best option. For the purpose of teaching inventive principles, some conventional aspects have been simplified or omitted. Those skilled in the art will appreciate variations from these implementations that fall within the scope of the disclosure. Those skilled in the art will also appreciate that the features described above can be combined in various ways to form multiple implementations. As a result, the invention is not limited to the specific implementations described above, but only by the claims and their equivalents.

What is claimed is:

1. An apparatus comprising:
   a network interface card (NIC) comprising an Ethernet network cable connector configured to carry Ethernet signaling of the NIC and a circuit board connector configured to carry Peripheral Component Interconnect Express (PCIe) signaling comprising host communications of the NIC;
   a connector card coupled to the NIC by the circuit board connector and comprising a device U.2 connector configured to carry the host communications of the NIC that is offset in position from a circuit board of the connector card to mate with a mating U.2 connector of a modular bay; and
   a carrier that houses the NIC and the connector card and is insertable into an envelope of the modular bay, the carrier configured to establish a stack-up among the connector card and the device U.2 connector offset from the circuit board of the connector card.

2. The apparatus of claim 1, the connector card comprising:
   hot-swap circuitry configured to enable hot-swapping of the device U.2 connector with regard to the mating U.2 connector.

3. The apparatus of claim 1, wherein the NIC positions the Ethernet network cable connector on a side of the carrier opposite than that of the device U.2 connector such that the Ethernet network cable connector is accessible after the carrier is inserted into the modular bay.

4. The apparatus of claim 1, the connector card comprising:
   power circuitry configured to distribute power received over the device U.2 connector for use by the NIC over the circuit board connector, and provide hot-swap capability to the NIC with respect to the mating U.2 connector.

5. The apparatus of claim 1, wherein PCIe signaling of the device U.2 connector is configured to carry NVM Express (NVMe) signaling comprising the host communications.

6. The apparatus of claim 1, wherein the host communications and power for at least the NIC and the connector card are carried by the device U.2 connector.

7. The apparatus of claim 1, wherien the device U.2 connector is coupled to the circuit board of the connector card via a flexible circuit that allows positioning of the device U.2 connector offset from the circuit board of the connector card.

8. The apparatus of claim 1, the connector card comprising:
   holdup circuitry configured to provide holdup power to at least the NIC after removal of the device U.2 connector from the mating U.2 connector.

* * * * *